United States Patent [19]
Furuhashi et al.

[11] Patent Number: 6,078,124
[45] Date of Patent: Jun. 20, 2000

[54] PIEZOELECTRIC TRANSFORMER DRIVING CIRCUIT AND DRIVING METHOD

[75] Inventors: Naoki Furuhashi; Shuuji Yamaguchi, both of Tokyo, Japan

[73] Assignee: NEC Corporation, Tokyo, Japan

[21] Appl. No.: 09/256,362

[22] Filed: Feb. 24, 1999

[30] Foreign Application Priority Data

Feb. 26, 1998 [JP] Japan .................................. 10-044140

[51] Int. Cl.[7] .......................... H01L 41/107; H02M 7/00
[52] U.S. Cl. ...................................... 310/318; 310/316.01
[58] Field of Search ................................ 310/316.01, 318

[56] References Cited

U.S. PATENT DOCUMENTS

| | | | |
|---|---|---|---|
| 4,703,213 | 10/1987 | Gasler .................................... | 310/316 |
| 5,654,605 | 8/1997 | Kawashima ............................. | 310/316 |
| 5,866,969 | 2/1999 | Shimada et al. ....................... | 310/318 |
| 5,894,184 | 4/1999 | Furuhashi et al. .................... | 310/316.01 |

FOREIGN PATENT DOCUMENTS

| | | | |
|---|---|---|---|
| 5-219730 | 8/1993 | Japan ............................. | H02M 3/24 |
| 6-96887 | 4/1994 | Japan ............................. | H05B 41/24 |
| 8-107678 | 4/1996 | Japan ............................. | H02M 7/48 |
| 8-251929 | 9/1996 | Japan ............................. | H02M 7/48 |
| 10-52068 | 2/1998 | Japan ............................. | H02M 7/538 |

*Primary Examiner*—Thomas M. Dougherty
*Attorney, Agent, or Firm*—Sughrue, Mion, Zinn, Macpeak & Seas, PLLC

[57] ABSTRACT

A piezoelectric transformer driving circuit and method can prevent degradation of characteristics of a piezoelectric transformer. A repetition frequency of a drive voltage lower than a predetermined value, sweeping range narrower than a predetermined range and an output voltage of the piezoelectric transformer higher than a predetermined reference value are detected by a load current comparing circuit and an output voltage comparing circuit. In response to the results of the comparisons, a sweeping range varying means varies the repetition frequency to be higher than an upper limit value of the sweeping range in a frequency sweeping oscillator. By variation, the sweeping of the output voltage of the piezoelectric transformer is initiated from a small value to correct an effective value of a piezoelectric transformer vibration velocity to prevent degradation of characteristics of the piezoelectric transformer.

16 Claims, 19 Drawing Sheets

PIEZOELECTRIC TRANSFORMER DRIVING CIRCUIT AND DRIVING METHOD

BACKGROUND OF THE INVENTION

1. Field of the Invention

The present invention relates generally to a piezoelectric transformer driving circuit and a driving method. More particularly, the invention relates to a driving circuit and a driving method for driving a piezoelectric transformer with sweeping a repetition frequency of a drive voltage within a predetermined sweeping range.

2. Description of the Related Art

In general, a piezoelectric transformer is an element to contact electrodes on a primary side and a secondary side to apply a voltage of resonant frequency of the transformer for resonating the transformer on the primary side and to take out a generated voltage on the secondary side generated by a mechanical vibration due to resonation. Such piezoelectric transformer is characterized by the capability of down-sizing and the reduction of thickness in comparison with an electromagnetic transformer and is drawing attention as a backlight of a display device with a liquid crystal and other devices.

As shown in FIG. 8A, the piezoelectric transformer has characteristics of a maximum transformation ratio in the vicinity of a resonant frequency f0, which is different from the characteristics of the electromagnetic transformer which has a fixed transformation ratio and a wide transmission band. For example, when the resonant frequency of the piezoelectric transformer is 117 kHz, the piezoelectric transformer has the transmission band of about several kHz. When the piezoelectric transformer is driven to obtain a given output, there is a method for making the transformation ratio variable by varying a driving frequency of the piezoelectric transformer. Conventionally, as the driving circuit of the piezoelectric element of this kind, there has been known the driving circuit disclosed in Japanese Unexamined Patent Publication No. Heisei 8-107678. The conventional circuit disclosed in the above-identified publication will be discussed with reference to FIG. 9.

As shown in FIG. 9, a driving circuit 401 is connected to a primary electrode 106 of a piezoelectric transformer 102. The driving circuit 401 amplifies a drive voltage into a voltage necessary for driving a piezoelectric transformer under control by a control signal 5050 from a frequency sweeping oscillator 405, for driving the piezoelectric transformer 102 from the primary electrode 106.

A secondary electrode 107 of the piezoelectric transformer 102 applies a voltage transformed by the piezoelectric transformer 102 to a high voltage terminals 108 of a load 103. A flow-out current from a load 103 flows into a load current comparing circuit 104 via a low voltage terminal 109 of the load 103.

In the load current comparing circuit 104, a load current is converted into a voltage and is compared with a reference voltage (VrefA) 110 corresponding to a preliminarily provided load current value. A frequency sweeping oscillator 405 determines a direction of sweeping 1040 in response to a result of comparison in the load current comparing circuit 104. Frequency sweeping operation will be discussed hereinafter with reference to the drawings.

The piezoelectric transformer 102 has frequencies of the same transformation ratio at respective one point on high frequency side and low frequency side of the resonant frequency, at which a maximum power is output. However, as shown in FIG. 8A, a power transmission ratio between input and output of the piezoelectric transformer is higher on the high frequency side than the low frequency side. Accordingly, in order to drive the piezoelectric transformer efficiently, it is preferred to operate the piezoelectric transformer on the higher side of the resonant frequency f0.

An operation of a piezoelectric transformer inverter is as illustrated in FIGS. 10A and 10B. As shown in FIG. 10A, until the input frequency of the piezoelectric transformer reaches a desired load current value, the frequency is swept from the high frequency side to the low frequency side. Then, at a timing where the desired load current value IH is exceeded as shown in FIG. 10B, a sweeping direction of the drive frequency is reversed to increase the frequency. Then, at a timing where the load current is varied across the desired load current value again, the sweeping direction of the drive frequency is reversed to decrease the frequency. By repeating this operation, the load current is held in the vicinity of the desired value. The foregoing operation is performed at a frequency higher than the resonant frequency.

On the other hand, when the desired load current is not reached, the frequency sweeping direction is reversed to increase the drive frequency at the lower limit of a preliminarily set frequency sweeping range by a frequency sweeping oscillator 405, as shown in FIG. 11A. At a timing where an upper limit of the preliminarily set frequency sweeping range is reached, sweeping of the frequency is initiated again to decreased until the desired load current IH is reached, as shown in FIG. 11C.

In this case, for example, as shown in FIG. 11B, when a control voltage value of the control voltage of the oscillator 522 reaches an upper limit voltage VH, a reset operation for an integrator 519 may be performed. Thus, the control voltage value repeats sweeping between the lower limit voltage VL and the upper limit voltage VH. The upper limit voltage VH may be set at 2V, for example, and the lower limit voltage VL may be set at 0.5V, for example. These values may be adjusted depending upon characteristics of the piezoelectric transformer and/or use condition thereof.

By setting of speed of elevating the drive frequency in the foregoing operation, operation for stabilizing the load current in the vicinity of the desired value can be performed at higher speed. In conjunction therewith, occurrence of resonation at the abnormal level can be prevented.

On the other hand, as shown in FIG. 8A, an upper limit fU of the frequency sweeping range is set to be higher than the resonant frequency f0, and a lower limit fD of the frequency sweeping range is set to be lower than the resonant frequency f0. Then, sweeping operation is performed between the upper limit fU and the lower limit fD of the frequency sweeping range as shown by arrows Ya1 and Ya2.

Here, the frequency sweeping oscillator 405 may be constructed with the integrator 519, a comparator 520 and an oscillator 522, as shown in FIG. 12. It should be noted that the integrator 519 is constructed to elevate an output voltage thereof at a given rate depending upon an output of the load current comparing circuit 104. The output voltage of the integrator 519 is input to the oscillator 522. The oscillator 522 outputs a frequency pulse inversely proportional to an input voltage value. The oscillator 522 is a voltage controlled oscillator which outputs the frequency pulse to the drive circuit 401. The oscillator 522 is constructed with a charge-and-discharge circuit 521, a resistor 524 and a capacitor 523. The oscillator 522 determines a current value to be charged and discharged to and from the capacitor 523 by an input voltage value from the integrator 519 and a resistance value of the resistor 524 so that the charge-and-discharge frequency of the capacitor 523 becomes an oscillation frequency.

The comparator 520 receives the output of the integrator 519 to compare with a reference voltage Vmin. Then, when the output voltage of the integrator 519 is higher than the reference voltage Vmin, a reset signal 5200 is output to the integrator 519. An output voltage of the integrator 519, to which the reset signal 5200 is input, becomes a minimum potential. By this, the drive frequency of the piezoelectric transformer 102 becomes the upper value of the sweeping range.

The oscillator 522 and the integrator 519 performs integrating operation and oscillating operation with charging and discharging the capacitor not shown. Namely, the integrator 519 performs integrating operation by charging and discharging the capacitor not shown. However, upon responding to input of the reset signal 5200, the integrator 519 drives an internal switch to make a not shown capacitor to discharge. By this, the operation shown in FIGS. 11A to 11C is performed.

On the other hand, the piezoelectric transformer has a characteristics to vary the transformation ratio by the load impedance. For example, referring to FIG. 13 showing a relationship between the transformation ratio and a drive frequency, at no load condition, the piezoelectric transformer has quite high transformation ratio to output quite high voltage. Namely, as shown in FIG. 13, a greater impedance value of the load causes a higher transformation ratio.

At this time, as shown in FIG. 14, a proportional relationship is established between the output voltage and a vibration velocity. Therefore, since the piezoelectric transformer is broken, a protection circuit becomes necessary. An output voltage comparator circuit 206 in FIG. 9 has a function for voltage division and rectification of the voltage output to a secondary electrode 107 of the piezoelectric transformer. Then, the divided and rectified voltage is compared with a reference voltage (VrefB) 212 to apply a result of comparison 2060 to the frequency sweeping oscillator 405.

As shown in FIG. 8B, when the frequency sweeping oscillator 405 has a function to switch the sweeping direction of the frequency from downward direction (direction of arrow Yb1) to upward direction (direction of arrow Y2) when the result of comparison of the output voltage comparator circuit 206 shows that the output voltage exceeds a preliminarily set reference voltage VrefB. By this function, when judgement is made that the load becomes open in certain reason to exceed the preliminarily set output voltage, the drive frequency of the piezoelectric transformer transit to a condition of low transformation ratio to lower the output voltage. By this function, by abrupt elevation of the output voltage of the piezoelectric transformer associating with abrupt increase of the load impedance, the piezoelectric transformer may prevent possible occurrence of breakage due to excessive vibration. A time division drive control circuit 306 in FIG. 9 generates a driving stop signal 4010 controlling an output duty according to a duty control voltage (Vduty) 307 at a low frequency as low as 1/100 with respect to the drive frequency of the piezoelectric transformer. The drive circuit 401 has a function to stop the drive voltage to be applied to the primary electrode of the piezoelectric transformer in response to the driving stop signal 4010 from the time division drive control circuit 306 to control an average output power of the piezoelectric transformer 102.

On the other hand, the frequency sweeping oscillator 405 stops sweeping of frequency in response to the driving stop signal from the time division drive control circuit 306 and shifts the frequency to a frequency slightly higher than the piezoelectric transformer drive frequency at the time of stopping. Upon initiation of frequency sweeping again in responsive to termination of the driving stop signal 4010 from the time division drive control circuit 306, the frequency sweeping oscillator 405 performs sweeping in a direction to lower the frequency from the frequency slightly higher than the drive frequency at the timing of stop sweeping. By this function, upon resumption of sweeping in the time division driving, a possible problem occurring in the load current control operation due to delay of the output voltage in relation to the driving waveform due to mechanical resonance, can be prevented.

The piezoelectric transformer driven circuit constructed as set forth above can be driven at high efficiency. In conjunction therewith, prevention of breakage due to opening of load which is a particular problem of the piezoelectric transformer, and prevention of a problem to be caused by interference of the average output power control for the display can be achieved. Accordingly, problems which hinders practical use of the piezoelectric transformer can be solved and inexpensive drive circuit can be realized.

However, in the foregoing prior art, there are two problems.

First problem is the possibility of occurrence of individual circuit, in which an effective value of vibration velocity at no load operation becomes high. Such circuit continues operation in a condition close to extreme of performance of the piezoelectric transformer per se, generated heat becomes large to potentially cause degradation of characteristics. When the vibration velocity of the piezoelectric transformer becomes high, abrupt heating can be caused as one example shown in FIG. 15 to reach Curie point to weaken polarization.

When load becomes open in certain reason and the output voltage comparing circuit 206 makes judgment that the output voltage exceeded the preliminarily set output voltage Vr, the frequency sweeping direction is switched from the downward direction to the upward direction. Then, the drive frequency is reversed to lower at a timing where the upper limit fU set in the frequency sweeping oscillator 405 is reached. This sequence of operation is shown in FIG. 16.

Referring to FIG. 16, in the sweeping operation of the drive frequency in upward and downward direction, the upper limit fU of the frequency sweeping range is determined by setting of a constant in the frequency sweeping oscillator 405. The oscillator 522 in the frequency sweeping oscillator 405 is frequently the voltage controlled oscillator circuit (VCO), oscillation frequency of which is determined depending upon the applied voltage value. The voltage controlled oscillator circuit is generally small in scale of the circuit and simple in control method.

FIG. 17A shows one example of a relationship between an oscillator control voltage V and the driving frequency, and a further relationship with the output voltage of the piezoelectric transformer at respective timings.

On the other hand, a capacity value of a charge-and-discharge capacitor of the voltage controlled oscillator circuit and a resistance value for determining a constant current value and so forth have tolerances. This deviation can cause problem in the inverter characteristics. This will be discussed hereinafter.

For example, it is assumed that the characteristics shown in FIG. 17A represents a data of a center value in designing in no load operation. A resonant frequency, at which the transformation ratio of the piezoelectric transformer mounted on the inverter becomes maximum, becomes a frequency lower than 119 kHz. In case of FIG. 17A, it is so designed that the upper limit of the frequency sweeping range becomes 125 kHz when the oscillator control voltage is 0.5V. By elevating the oscillation control voltage from this condition, the oscillation frequency is lowered and the output voltage is increased.

When the output voltage of the piezoelectric transformer exceeds 18 kVo-p, the output voltage comparing circuit 206, is constructed to apply the signal for reversing the frequency sweeping direction to the frequency sweeping oscillator. Then, when the drive frequency is lowered down to 119 kHz, at which the output voltage becomes 1.8 kVo-p, the sweeping direction is reversed and the oscillator control voltage is lowered down to 0.5V. At the timing where the oscillator control voltage becomes 0.5V, the foregoing sequence of operation is repeated again.

Here, one, in which the frequency sweeping operation shown in FIG. 17A is re-written on transformation ratio-drive frequency curve, is shown in FIG. 18A. In FIG. 18A, the resonant frequency is f0. Then, between f1 at 119 kHz and f2 at 125 kHz, sweeping operation of the drive frequency is performed as shown by arrow Ya.

However, due to fluctuation of characteristics of respective parts forming the oscillator, individual circuit causing behavior shown in FIG. 17B can occur even when parts having the same nominal values are used. The individual circuit has the oscillation frequency of 120 kHz when the oscillator control voltage is 0.5V.

Since the piezoelectric transformer has strong resonant characteristics, the output voltage as driven at 120 kHz becomes significantly greater than the former driven at 125 kHz as design center value. From this condition, by elevating the oscillator control voltage, the oscillation frequency is lowered and the output voltage is increased. Similarly to the former, at a timing where the drive frequency reaches 119 kHz, the output voltage of the piezoelectric transformer becomes 1.8 kVo-p. Then, the output voltage comparing circuit 206 feeds a sweeping direction reversing signal to the frequency sweeping oscillator 405. By this, the oscillator control voltage returns to 0.5V, the drive frequency returns to 120 kHz. At this timing, again the oscillator control voltage is elevated and the drive frequency is lowered.

As shown in FIG. 17B, in such condition, since the sweeping range of the drive frequency is narrow and operation is continued in a range where the transformation ratio of the piezoelectric transformer 102 is high, high voltage output is continued. The characteristics re-written the frequency sweeping operation shown in FIG. 17B on the transformation ratio-drive frequency curve, is shown in FIG. 18B. In FIG. 18B, the resonant frequency is f0. Between f1 at 119 kHz and f3 at 120 kHz, sweeping operation of the drive frequency is performed as shown by arrow Yb.

On the other hand, as shown in FIG. 14, there are substantially proportional relationships between the vibration velocity of the piezoelectric transformer and the output voltage. Therefore, vibration velocity on the horizontal axis in FIG. 15 can be replaced with the output voltage of the piezoelectric transformer. On the other hand, the output voltage value can be converted into corresponding drive frequency. In FIG. 18C, a relationship between the drive frequency and the elevation of the surface temperature of the piezoelectric transformer in the procedure set forth above, is shown.

In FIG. 18C, a temperature corresponding to the drive frequency f1 (119 kHz) is represented by Tf1, a temperature corresponding to the drive frequency f2 (120 kHz) is represented by Tf3, and a temperature corresponding to f3 (125 kHz) is represented by Tf2. In case of FIG. 18A, the sweeping operation is performed in the direction shown by the arrow Ya, and in case of FIG. 18B, the sweeping operation is performed in the direction shown by the arrow Yb.

Referring to FIG. 18C, it may be appreciated that the drive frequency having low and narrow frequency sweeping range as shown in FIG. 17B, is driven in a range where elevation of the surface temperature of the piezoelectric transformer is high in comparison with the drive frequency having frequency sweeping range of the design center as shown in FIG. 17A.

Essentially, the reason of designing to perform operation shown in FIG. 17A is as follow. Namely, when the circumference is low temperature or dark, an impedance of a cold-cathode tube to be a load becomes higher than a normal impedance. The piezoelectric transformer is required to output a voltage requiring for initiation of lighting of the load in this condition. However, if the output value is maintained constantly, vibration velocity of the piezoelectric transformer per se becomes high to continue operation in the condition close to an extreme of performance thereof. Therefore, degradation of characteristics is caused due to elevation of temperature in the piezoelectric transformer.

Therefore, sweeping is initiated from a high frequency having low vibration velocity. By returning the frequency higher at a timing where sweeping of frequency is lowered to obtain the output voltage necessary for lighting the load, lowering of effective value of the vibration velocity than necessary voltage continuous with maintaining outputting of the necessary voltage, is realized.

However, in the operation state shown in FIG. 17B, the effective value of the vibration velocity becomes high. Therefore, since the piezoelectric transformer per se continues operation in a condition close to the extreme of performance, temperature elevation becomes large to cause degradation of the characteristics.

The second problem is that it is difficult in the light of design to shift the upper limit value of the sweeping frequency range of the frequency sweeping oscillator 405 upon resetting of the integrator 519 in the frequency sweeping oscillator 405. Namely, by shifting the setting of the upper limit value of the sweeping frequency range upon resetting of the integrator 519, higher in design, the foregoing first problem may be resolved. However, the following problem may be encountered.

A driving waveform fed from the driving circuit 401 to the piezoelectric transformer 102 has a characteristics for transmitting a power only in narrow band of the piezoelectric transformer. Therefore, since high harmonic component is not used, efficiency becomes high as driven by a sine wave. Therefore, wave shaping is performed to obtain the sine wave at the desired load current output frequency fH in FIG. 8A. In the light of simplification of a circuit construction, a method for shaping into the sine wave by an equivalent circuit of the piezoelectric transformer and a coil on a drive circuit side. Therefore, at higher frequency beyond the desired load current output frequency, error of timing of zero volt switching becomes greater to destroy the sine waveform. Then, degradation of conversion efficiency in the drive circuit 401 is caused to increase heating of the circuit parts to cause a problem in reliability.

On the other hand, the piezoelectric transformer 102 determines its own resonant frequency by the shape thereof. At the same time, frequencies to cause vibrations in the lateral direction or torsional mode other than normal orientation are also determined. If the piezoelectric transformer 102 is in operation at the frequency where lateral vibration and torsional vibration are caused, conversion efficiency in the piezoelectric transformer 102 is degraded to generate heat to cause reliability.

Referring to FIG. 19, the frequencies identified by "x" are the frequencies causing lateral vibration or torsional vibration. As can be clear from FIG. 19, at a wider effective sweeping frequency range, greater number of frequencies to cause lateral vibration or torsional vibration may be included.

A solution for the first problem is to shift the upper limit value of the frequency sweeping range higher. To the contrary to this, a solution for the second problem is to shift the upper limit value of the frequency sweeping range lower. Therefore, trade-off is caused in the solutions of the first problem and the second problem to make designing difficult.

It should be noted that as the prior art relating to the frequency sweeping method of the inverter, the following are known. At first, in Japanese Unexamined Patent Publication No. Heisei 8-251929, an object is to constantly perform efficient operation even when the input power source or load is fluctuated. For this purpose, the output of the piezoelectric transformer reaching the predetermined value is detected, and subsequently, with sweeping the oscillation frequency of the drive frequency control circuit by the frequency sweeping circuit across the resonant frequency of the piezoelectric transformer, efficiency is detected by an efficiency calculation circuit. Then, a frequency where the efficiency becomes maximum is detected for subsequently driving the frequency where the efficiency becomes optimal.

On the other hand, Japanese Unexamined Patent Publication No. Heisei 6-96887 discloses a system including a direct current power source, in which a commercial power source is rectified and smoothed and is directed for prevention of abnormal oscillation even when the voltage becomes lower than or equal to a predetermined value. The disclosed system monitors an output voltage of the direct current power source for switching a resistance value of the oscillation circuit so that the oscillation frequency will not be lowered less than or equal to the predetermined frequency.

Also, Japanese Unexamined Patent Publication No. Heisei 5-219730 is directed to control an output current constant with respect to an environmental temperature. A power source voltage and a load is provided with an oscillator variable of oscillation frequency on the basis of the output of the current detection means.

However, none of these publications are directed to protecting the operation of the piezoelectric transformer, and has means for performing protection, and thus the foregoing problems cannot be solved.

SUMMARY OF THE INVENTION

The present invention solves the problems in the prior art. It is an object of the present invention to provide a piezoelectric transformer driving circuit and a driving method which can drive a piezoelectric transformer efficiently, achieves high general applicability and can be down-sized and reduced in cost.

According to one aspect of the present invention, a piezoelectric transformer driving circuit driving a piezoelectric transformer with a driving voltage with sweeping a repetition frequency of the driving voltage within a predetermined sweeping range between an upper limit value and a lower limit value, comprises:

detecting means for detecting that the piezoelectric transformer is outputting high voltage non-interruptedly; and varying means for varying a repetition frequency higher than the upper limit value in response to a result of detection by the detecting means.

The detecting means may detect the piezoelectric transformer outputting high voltage non-interruptedly by setting the repetition frequency lower than a predetermined value, the sweeping range narrower than a predetermined range and an output voltage of the piezoelectric transformer greater than a predetermined reference value. Also, the detecting means may detect the piezoelectric transformer outputting high voltage non-interruptedly by setting the repetition frequency lower than a predetermined value and the sweeping range narrower than the predetermined range.

In the preferred construction, the detecting means may include first detecting means for detecting that the repetition frequency is low and the weeping range is narrow and second detecting means for detecting an output voltage of the piezoelectric transformer intermittently exceeding the predetermined reference value, when both of detection outputs of the first and second detecting means are output, judgment may be made that the piezoelectric transformer outputs the high voltage non-interruptedly. The first detecting means may detect the repetition frequency lower than a predetermined frequency and variation range of the frequency is narrower than a predetermined range. The first detecting means may include integrating means for integrating voltage controlling repetition frequency of the drive voltage of the piezoelectric transformer and comparing means for comparing an integration result and a predetermined reference voltage value, the first detecting means may detect the repetition frequency lower than a predetermined frequency and variation range of the frequency narrower than a predetermined range on the basis of result of comparison by the comparing means.

The repetition frequency of the drive voltage may be generated depending upon an output frequency of an oscillator which is formed with a resistor and a capacitor and determines an oscillation frequency, and the varying means may control variation of oscillation frequency of the oscillator by controlling a current flowing through the resistor. The varying means may include a switching transistor controlling a current flowing through the resistor and controls ON and OFF of the transistor depending upon detection result of the detecting means.

According to another aspect of the present invention, a piezoelectric transformer driving method driving a piezoelectric transformer with a driving voltage with sweeping a repetition frequency of the driving voltage within a predetermined sweeping range between an upper limit value and a lower limit value, comprises:

detecting step of detecting that the piezoelectric transformer is outputting high voltage non-interruptedly; and varying step of varying a repetition frequency higher than the upper limit value in response to a result of detection by the detecting means.

The detecting step may detect the piezoelectric transformer outputting high voltage non-interruptedly by setting the repetition frequency lower than a predetermined value, the sweeping range narrower than a predetermined range and an output voltage of the piezoelectric transformer greater than a predetermined reference value. The detecting step may detect the piezoelectric transformer outputting high voltage non-interruptedly by setting the repetition frequency lower than a predetermined value and the sweeping range narrower than the predetermined range.

The detecting step may include first detecting step of detecting that the repetition frequency is low and the weeping range is narrow and second detecting step of detecting an output voltage of the piezoelectric transformer intermittently exceeding the predetermined reference value, when both of detection outputs of the first and second detecting steps are output, judgment may be made that the piezoelectric transformer outputs the high voltage non-interruptedly. The first detecting step may detect the repetition frequency lower than a predetermined frequency and variation range of the frequency is narrower than a predetermined range. In the first detecting step, voltage controlling repetition frequency of the drive voltage of the piezoelectric transformer may be integrated and an integration result and a predetermined reference voltage value are compared, for detecting the repetition frequency lower than a predetermined frequency and variation range of the frequency is narrower than a predetermined range on the basis of result of comparison.

The repetition frequency of the drive voltage may be generated depending upon an output frequency of an oscillator which is formed with a resistor and a capacitor and determines an oscillation frequency, and the varying step may control variation of oscillation frequency of the oscillator by controlling a current flowing through the resistor. The varying step may include a switching transistor controlling a current flowing through the resistor and may control ON and OFF of the transistor depending upon detection result of the detecting means.

In short, the drive circuit for the piezoelectric transformer according to the present invention makes judgment that the piezoelectric transformer outputs the high voltage continuously (non-interruptedly) when the repetition frequency of the drive voltage is lower than a predetermined value, the sweeping range is narrower than the predetermined range and the output voltage of the piezoelectric transformer is greater than the predetermined reference value, to vary repetition frequency to be higher than the upper limit value. By this variation, sweeping of the output voltage of the piezoelectric transformer is initiated from smaller value to correct the effective value of the piezoelectric transformer vibration velocity small to degrade characteristics of the piezoelectric transformer.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

Figure 1:
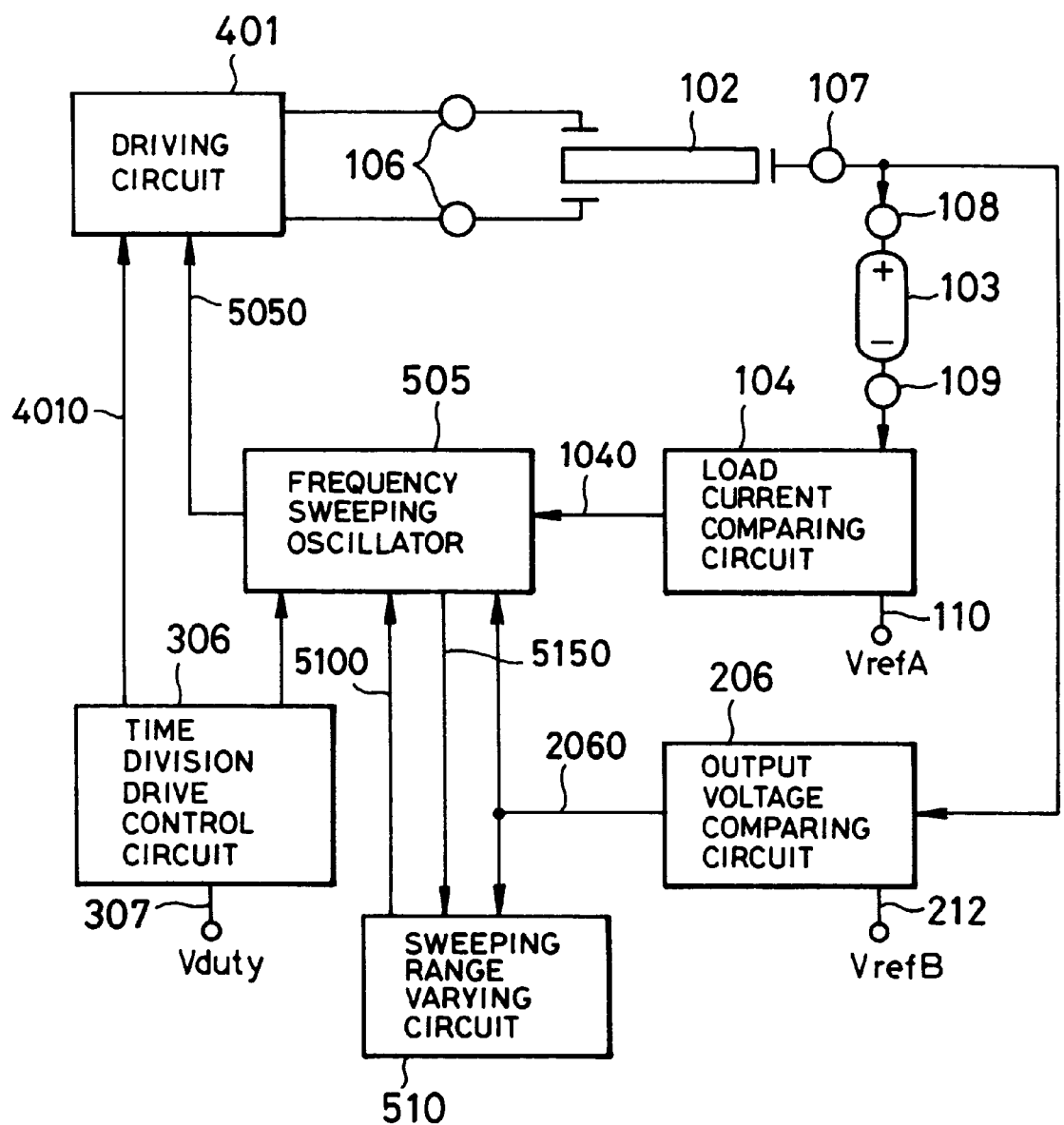
FIG. 1 is a block diagram showing a construction of one embodiment of a piezoelectric transformer driving circuit for implementing the present invention.
Figure 9:
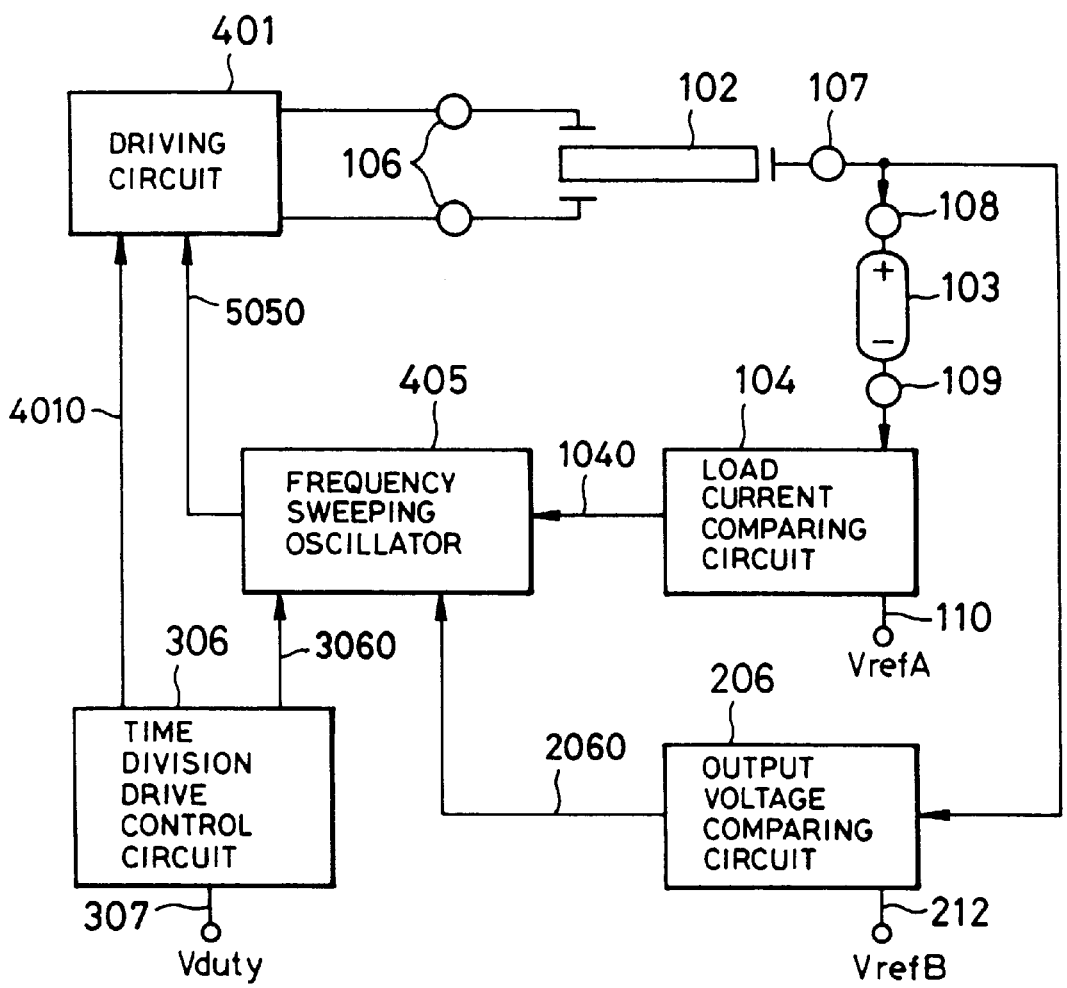
FIG. 9 is a block diagram showing a construction of the conventional piezoelectric transformer driving circuit.
Figure 10A:
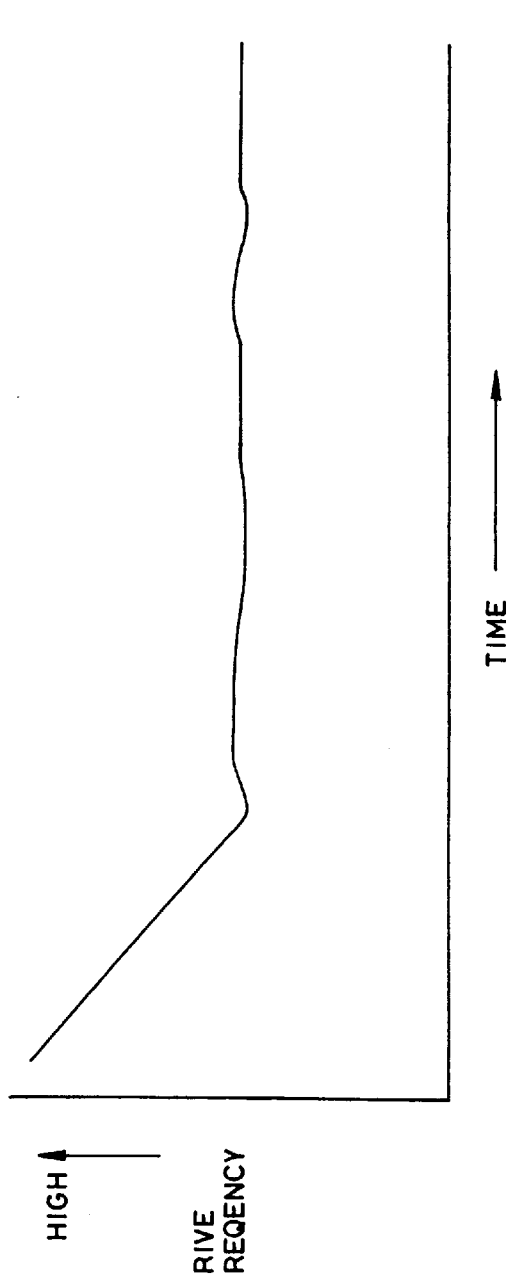
FIGS. 10A and 10B are illustrations showing operation upon initiation of operation of a piezoelectric transformation inverter.
Figure 10B:
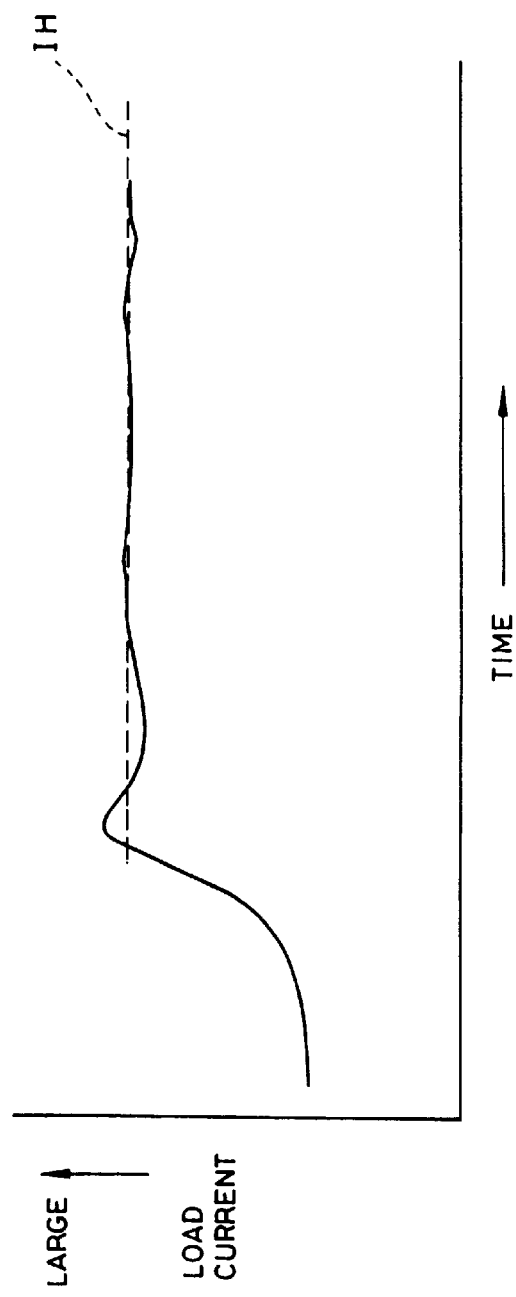

FIG. 1 is a block diagram showing one embodiment of a piezoelectric transformer drive circuit according to the present invention. In FIG. 1, like components to those of FIG. 9 are represented by like reference numerals to neglect detailed description for avoiding redundant discussion to keep the disclosure simple enough for facilitating clear understanding of the present invention. In FIG. 1, a point where the shown embodiment of the piezoelectric transformer driving circuit is differentiated from the conventional circuit resides in a new sweeping range varying circuit 510. By shifting an upper limit value of a sweeping frequency of an oscillation circuit upwardly only when the sweeping range varying circuit detects continuation of high voltage output for preventing degradation of piezoelectric transformer characteristics due to continuation of high voltage output.

Here, a detecting method for detecting continuation of high voltage output in the circuit shown in FIG. 1, is a method monitoring a control voltage of a voltage controlled oscillator and detects that the control voltage is fluctuating within a low voltage range, and simultaneously, detecting an excessive voltage by an output voltage comparing circuit 206 for detecting continuation of high voltage in output of the piezoelectric transformer. This is a high voltage continuation detecting method established by combining characteristics of the voltage controlled oscillator and characteristics of the piezoelectric transformer.

Hereinafter, more particular discussion will be given for the shown embodiment of the driving circuit for the piezoelectric transformer. In FIG. 1, the shown driving circuit has high output impedance and operation thereof depends upon an impedance of the load. Therefore, the driving circuit is characterized in generating high voltage when an impedance of the load is high for driving the piezoelectric transformer 102 which outputs an alternating current voltage input from a primary side electrode to a secondary side using a piezoelectric effect. Then, the shown driving circuit is constructed with a driving circuit 401 connected to the primary electrode 106 of the piezoelectric transformer 102 and converting a power source voltage into an input voltage value necessary for enabling the piezoelectric transformer 102 to output a predetermined output according to a control signal from the frequency sweeping oscillator 505 and the time division drive control circuit 306, the load current comparison circuit 104 connected to the load 103 for receiving a load current to compare with a desired value and outputting the result of comparison to the frequency sweeping oscillator 505, and the frequency sweeping oscillator 505 receiving respective signals from the load current comparison circuit 104, the output voltage comparing circuit 206, the sweeping range varying circuit 510 and the time division drive control circuit 306 to output a driving frequency signal of the piezoelectric transformer for the driving circuit 401.

On the other hand, the shown piezoelectric transformer driving circuit is constructed with the output voltage comparing circuit 206 outputting a signal for returning the drive frequency of the piezoelectric transformer 102 to the upper limit value of the sweeping range to the frequency sweeping oscillator 505 when an excessive voltage of the output is detected, the time division control circuit 306 generating the drive stop signal for the driving circuit 401 to perform duty control and outputting the control signal so as not to vary the output of the frequency sweeping oscillator while drive is stopping, and the sweeping range varying circuit 510 outputting a frequency sweeping range varying signal for the frequency sweeping oscillator 505 upon detection that a width of the frequency sweeping range is narrow upon detection of an excessive voltage output from signals of the output voltage comparing circuit 206 and the frequency sweeping oscillator 505.

In the drawings, the load 103 is connected to the secondary electrode 107 of the piezoelectric transformer to receive output of the piezoelectric transformer 102 to supply the load current to the load current comparing circuit 104.

In the shown embodiment of the driving circuit, the different from the conventional circuit shown in FIG. 9 is that the sweeping range varying circuit 510 is added. By providing the sweeping range varying circuit 510, upon detection that the sweeping frequency width upon no load operation is narrow and high voltage output is continued, the upper limit value of the sweeping frequency is shifted to higher frequency to widen the sweeping frequency range. Thus, degradation of characteristics of the piezoelectric transformer due to continuation of high voltage output can be prevented.

Figure 2:
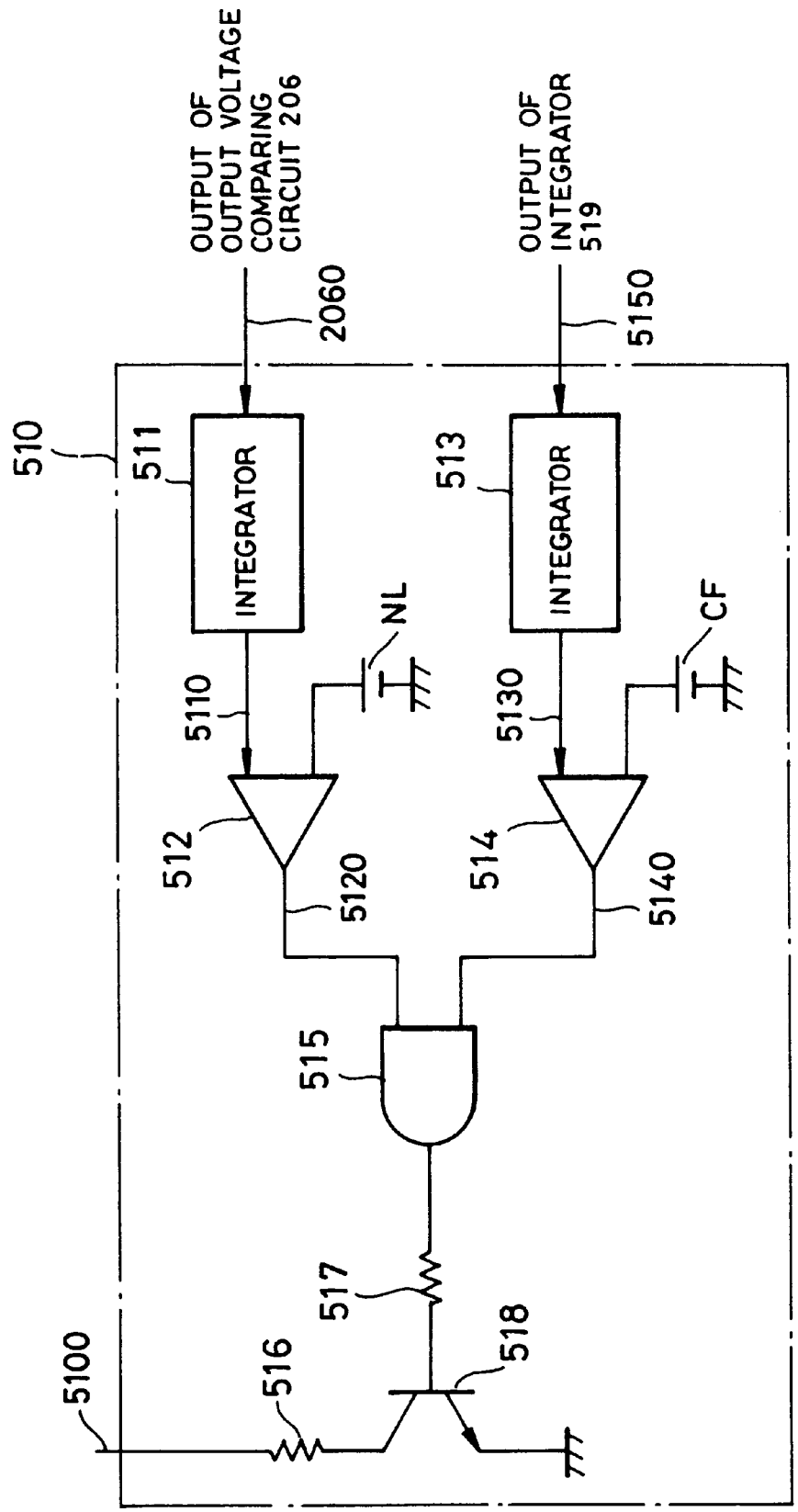
FIG. 2 is a block diagram showing an embodiment of an internal construction of a sweeping range varying circuit in FIG. 1.

FIG. 2 is a block diagram showing an embodiment of the internal construction of the sweeping range varying circuit 510. The input signal of the sweeping range varying circuit 510 is consisted of two signals of the output 2060 of the output voltage comparing circuit 206 and the output 5150 of the integrator 519 in the frequency sweeping oscillator 505.

On the other hand, the output 2060 of the output voltage comparing circuit 206 disclosed in the prior art shown in FIG. 9, is input only to the frequency sweeping oscillator 405. In the circuit of FIG. 1, the output 2060 of the output voltage comparing circuit 206 is distributed to the sweeping range varying circuit 510 in addition to the frequency sweeping oscillator 505.

Figure 16:
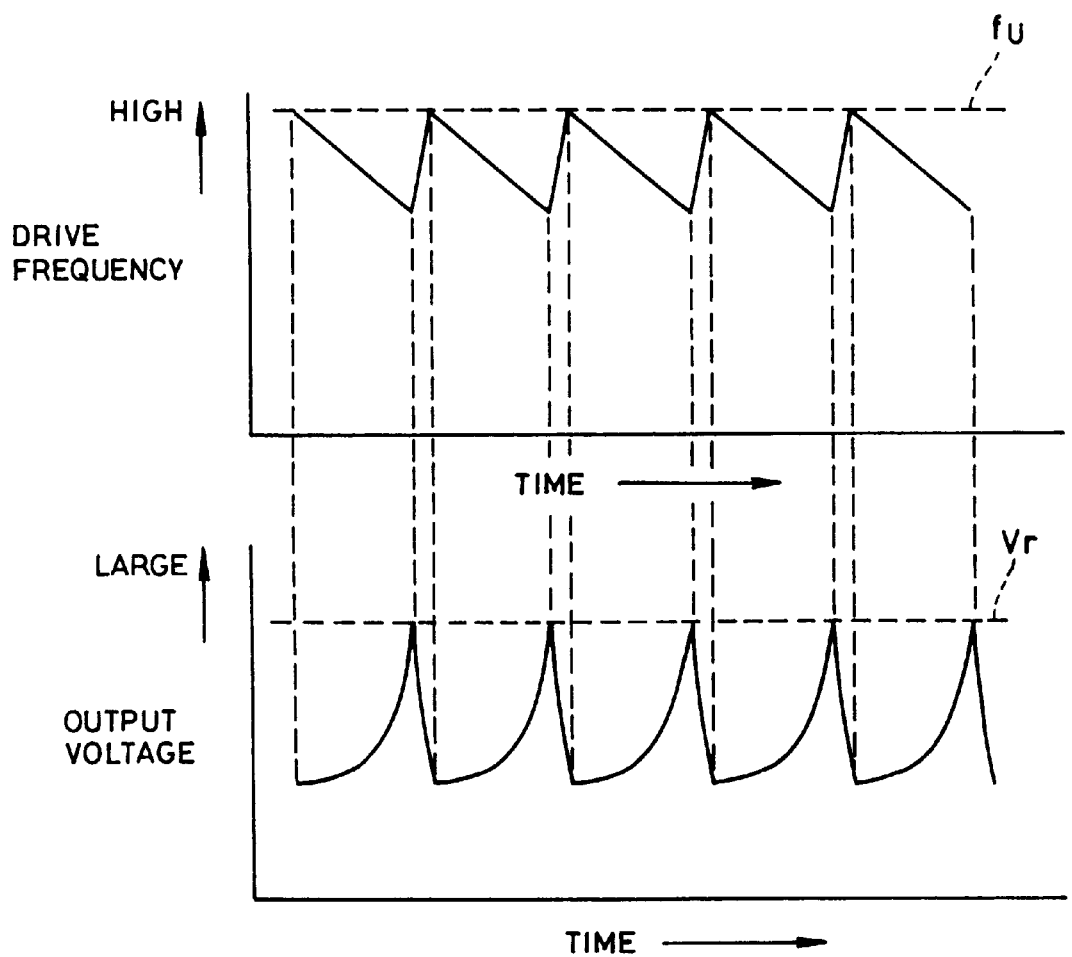
FIG. 16 is an illustration showing a relationship between a drive frequency of the piezoelectric transformer and the output voltage.

However, both of the output voltage comparing circuits 206 are identical in the circuit construction and generate the same output signals. This signal is output when the output of the piezoelectric transformer 102 is higher than a set reference as compared in the output voltage comparing circuit 206. Since the output voltage of the piezoelectric transformer at the no load operation has a waveform as illustrated in FIG. 16, the output of the output voltage comparing circuit 206 becomes a pulse form signal.

Figure 3:
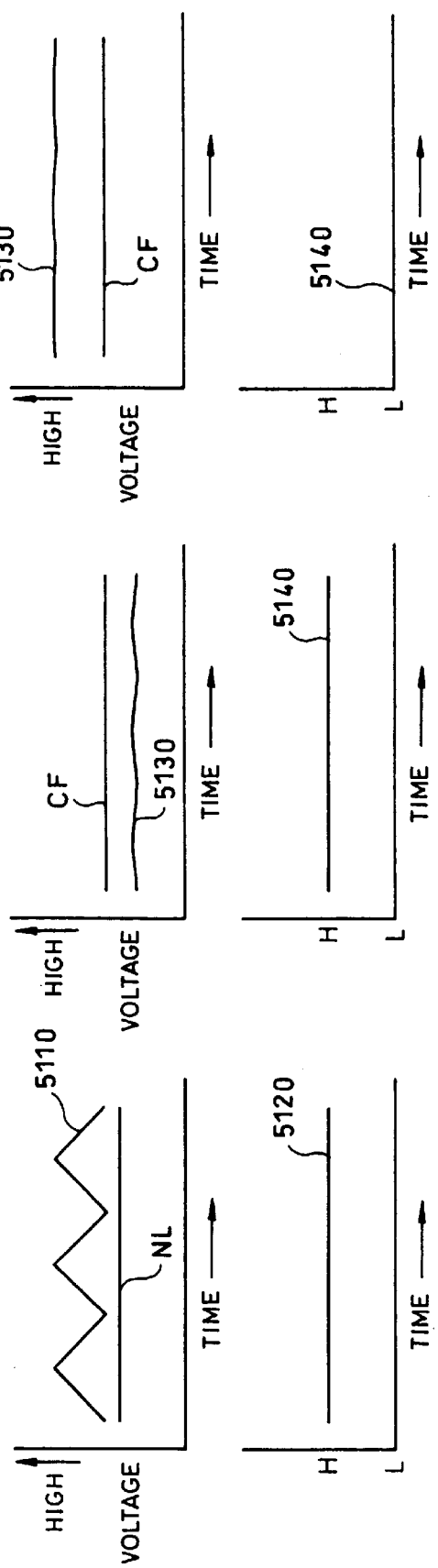
FIG. 3A is a waveform chart showing a relationship between an output of an integrator 511 upon no load operation and an output of a comparator 512.
FIG. 3B is a waveform chart showing a relationship between an output of an integrator 513 and an output of a comparator 514.
FIG. 3C is a waveform chart showing a relationship between an output of the integrator 513 in stable lighting operation upon load connection and an output of the comparator 514.

The output 2060 from the output voltage comparing circuit 206 is integrated by the integrator 511, and thereafter is compared with a reference voltage NL in the comparator 512. The reference voltage NL is set at a value smaller than the output 5110 of the integrator 511 in the no load operation so that high level voltage is output from the comparator 512 during a period where the output 5110 of the integrator 511 is higher than the reference voltage NL. Accordingly, the output 5110 of the integrator 511 at no load operation, the reference voltage NL and the output 5120 of the comparator 512 are as shown in FIG. 3A. Namely, the output 5110 of the integrator 511 becomes a voltage value constantly higher than the reference voltage NL to maintain the output 5120 of the comparator 512 constant at high level (H).

It should be noted that, during stable lighting operation at load connected state, since the output of the piezoelectric transformer 102 does not exceed a judgment criterion of the output voltage comparing circuit 206, no output is generated in the output voltage comparing circuit 206. Thus, no output is present in the integrator 511 to maintain the output of the comparator 512 at low level.

Figure 4:
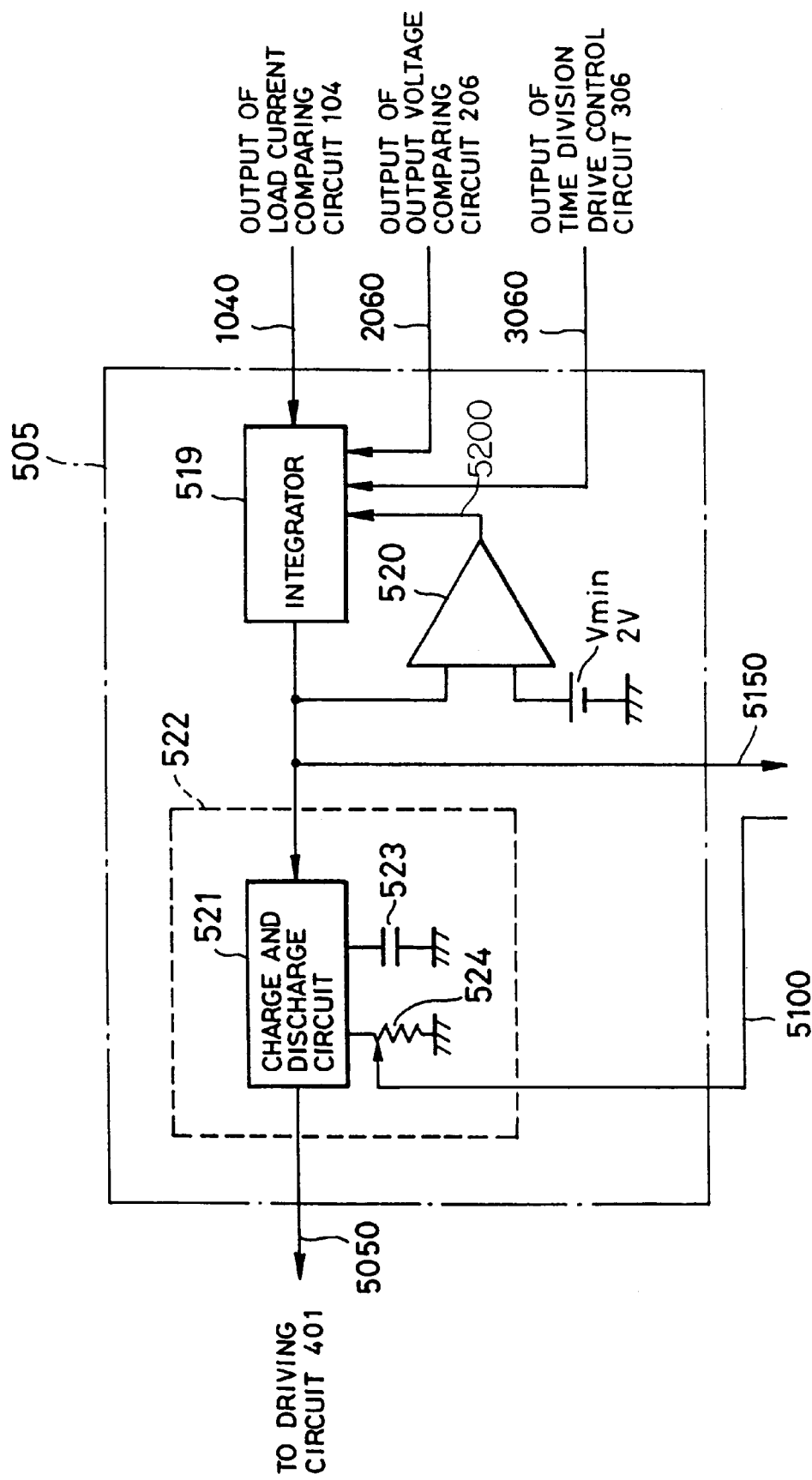
FIG. 4 is a block diagram showing an embodiment of an internal construction of a frequency sweeping oscillator in FIG. 1.
Figure 12:
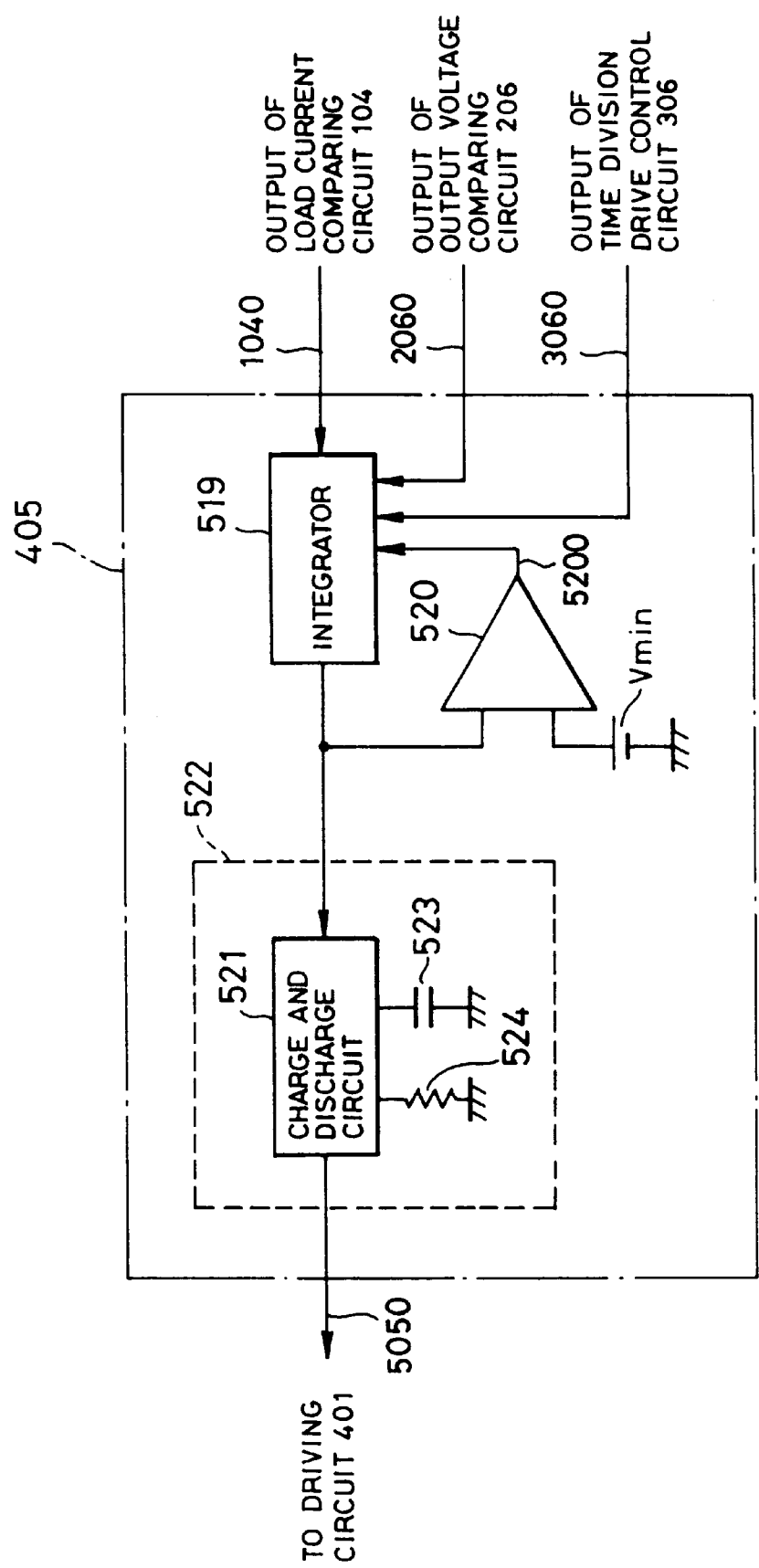
FIG. 12 is a block diagram showing an example of the internal construction of the frequency sweeping oscillator in FIG. 9.
Figure 13:
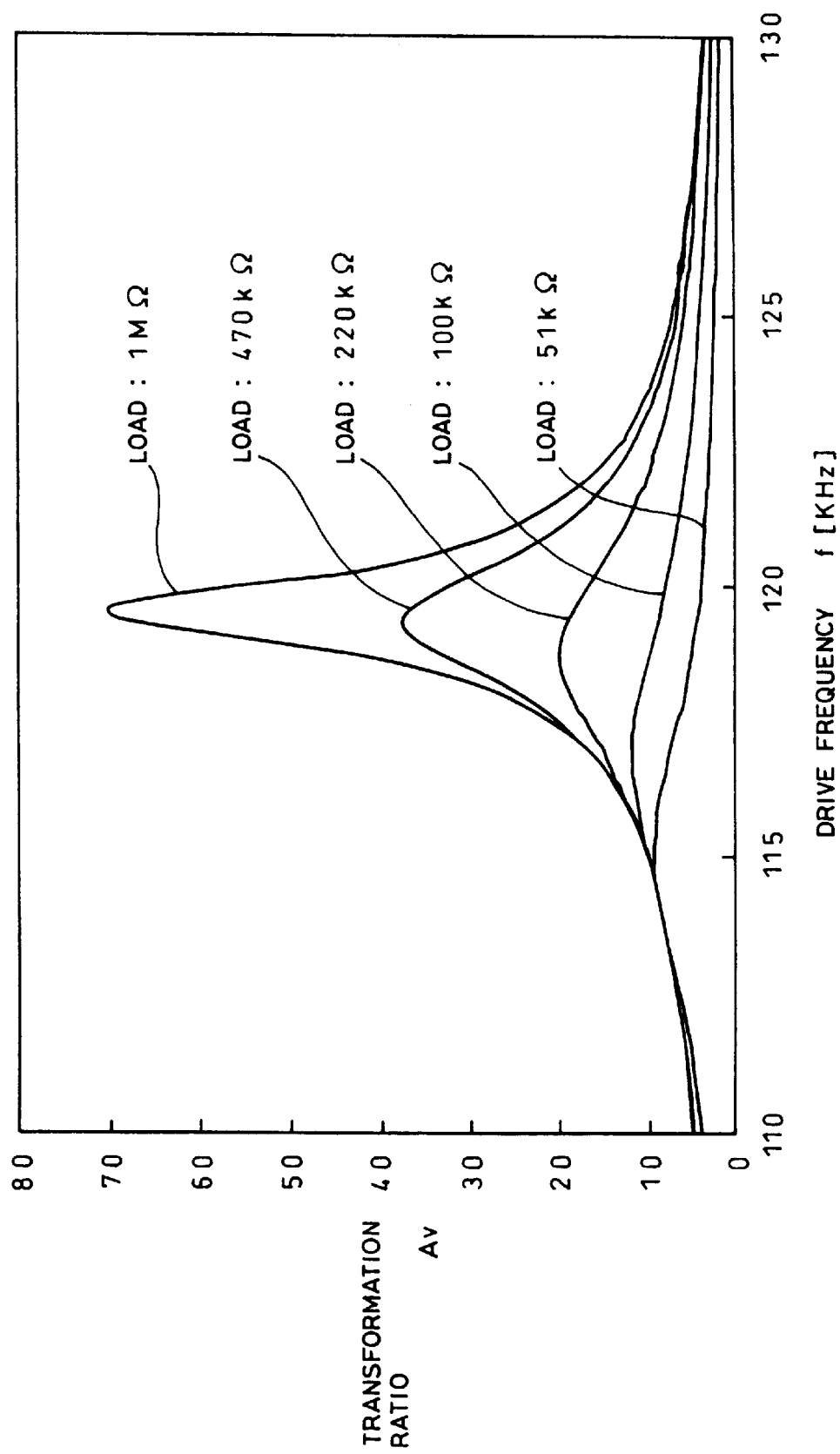
FIG. 13 is an illustration showing a relationship between a transformation ratio of the piezoelectric transformer and the drive frequency.
Figure 14:
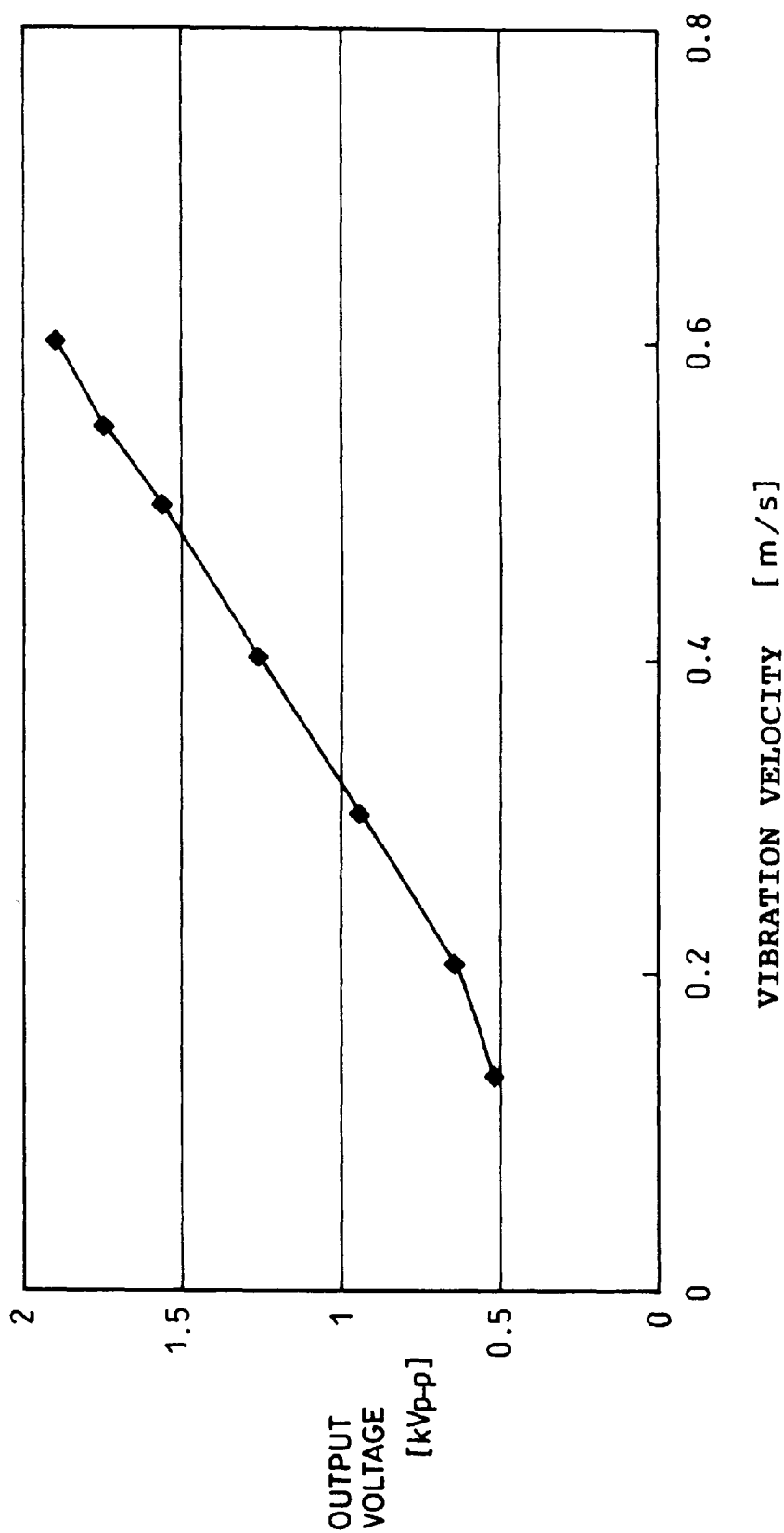
FIG. 14 is an illustration showing a relationship between an output voltage of the piezoelectric transformer and a vibration velocity.
Figure 15:
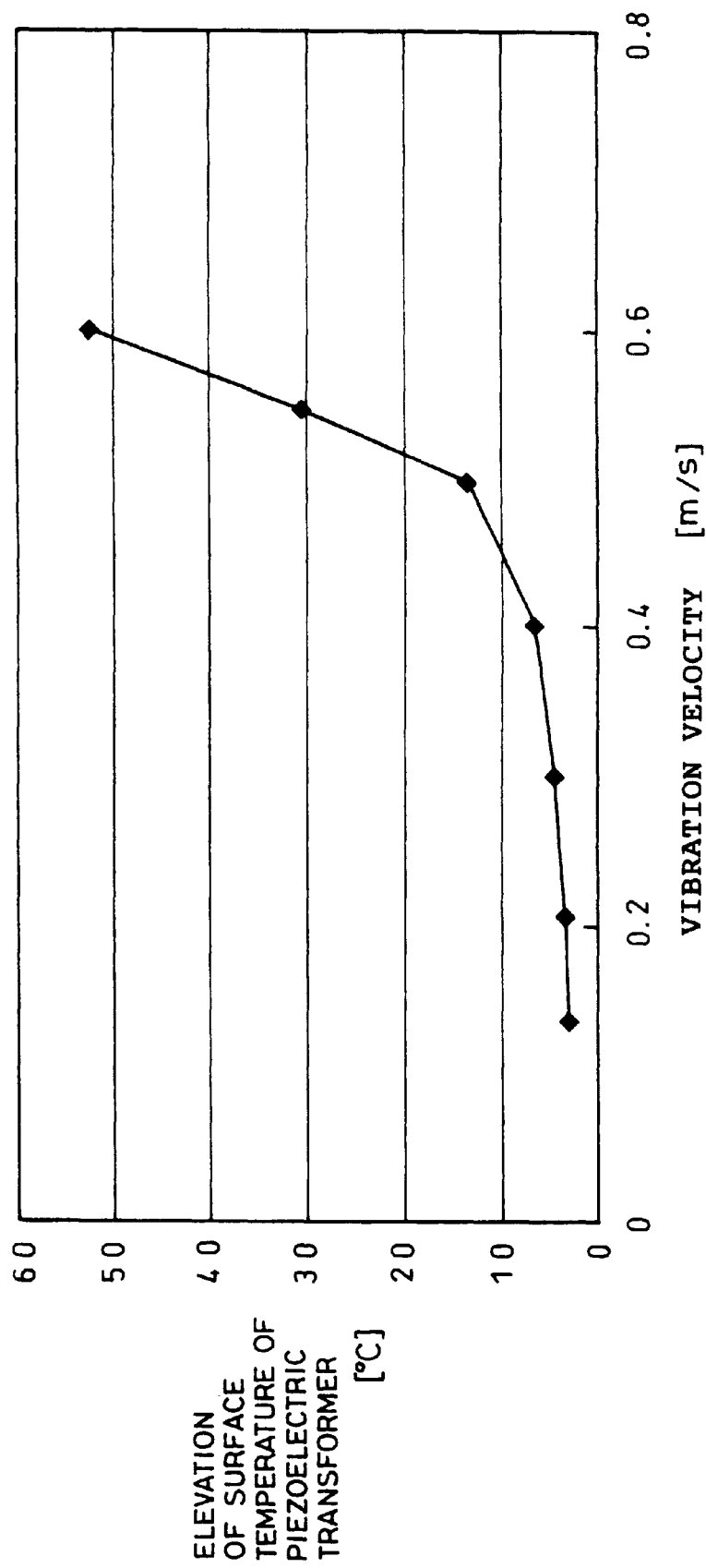
FIG. 15 is an illustration showing a relationship between a temperature elevation value of the piezoelectric transformer and the vibration velocity.

Next, discussion will be given for the frequency control circuit 505 outputting one input signal to the sweeping range varying circuit 510. As shown in FIG. 4, the frequency sweeping oscillator 505 is constructed with including the integrator 519, the comparator 520 and the oscillator 522. It should be noted that, in FIG. 4, like elements to those in FIG. 12 may be identified by like reference numerals and discussion for such common elements are neglected in order to avoid redundant disclosure for keeping the disclosure simple enough to facilitate clear understanding of the present invention.

The integrator 519 is constructed to elevate the output voltage at a constant rate depending upon the output 1040 of the load current comparing circuit 104. The output voltage of the integrator 519 is input to the oscillator 522. The oscillator 522 outputs a frequency pulse inversely proportional to the voltage value input thereto. The oscillator 522 is the voltage controlled oscillator and outputs the frequency pulse to the drive circuit 401.

Figures 11A, 11B, 11C:
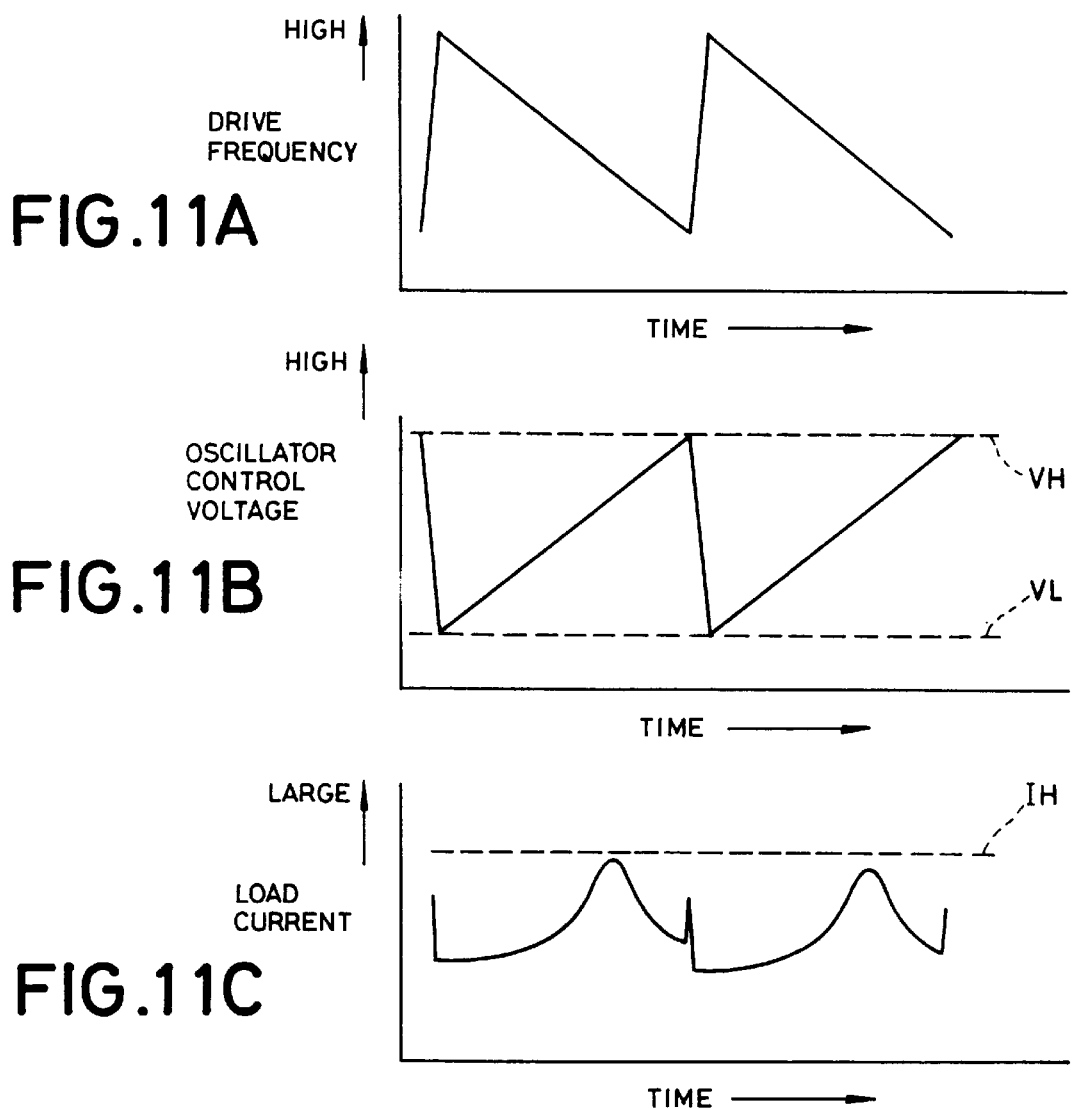
FIGS. 11A to 11C are waveforms showing variation of a drive frequency, an oscillator control voltage and a load current.

The comparator 520 receives the output of the integrator 519 and compares the same with a reference voltage Vmin. Then, when the output voltage of the integrator 519 is large, a reset signal 5200 is output to the integrator 519. The integrator 519 receiving the reset signal 5200 lowers the output voltage to the minimum potential. By this, the drive frequency of the piezoelectric transformer 102 becomes the upper limit value of the sweeping range. The foregoing operation is shown in FIG. 11 set forth above.

Even when the excessive voltage detection signal is received from the output voltage comparing circuit 206, the integrator 519 is reset to make the output voltage at the minimum potential so that the drive frequency becomes the upper limit of the sweeping range. During a period where the drive stop signal is received from the time division drive control circuit 306, the integrator 519 lowers the output voltage slightly. Upon reception of the drive start signal again, driving is resumed from the frequency slightly higher than the frequency upon stop driving. By this, it becomes possible to prevent drawback of lowering of the drive frequency of the piezoelectric transformer due to lacking of the load current caused by delay of the output voltage relative to the drive waveform due to rising of mechanical resonation of the piezoelectric transformer upon resumption of driving.

The oscillator 522 determined the current value to be charged and discharged in the capacitor by the input voltage from the integrator 519 and the value of the resistor 524. The charge and discharge frequency of the capacitor 523 becomes oscillation frequency.

Figure 17B:
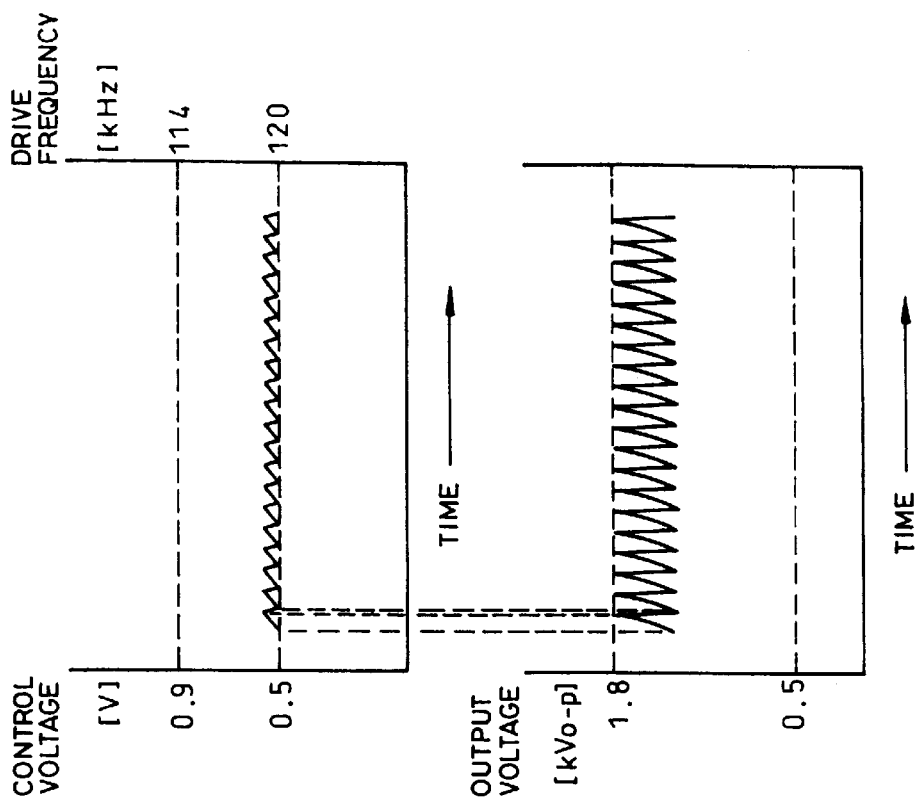
FIGS. 17A and 17B are illustrations respectively showing relationship between an oscillator control voltage and the drive frequency and a relationship between the oscillator control voltage and the output voltage of the piezoelectric transformer at the corresponding timing.

In the sweeping range varying circuit 510, the output signal of the integrator 519 is input. The output signal integrated by the integrator 519 is input to the comparator 514 to compare with the reference voltage CF. The case of the individual product shown in FIG. 17B, is an example where the oscillation frequency range of the oscillator 522 is shifted to lower band side. Since the output of the integrator 519 is held within a range of low voltage, the output of the integrator 513 in the sweeping range varying circuit 510 is held within a range of low voltage. The output of the integrator 513 is input to the comparator 514 to be compared with the reference voltage CF.

Here, the extent of the frequency sweeping range in the no load operation is converted into the oscillation control voltage range. The value thus converted is set as the reference voltage CF. When the comparator 514 is set the output high level when the frequency sweeping range width set by the reference voltage CF is not satisfied. In this case, the comparator 514 performs operation shown in FIG. 3B. Namely, since the output 5130 of the integrator 513 is constantly lower voltage value than the reference voltage CF, the output 5140 of the comparator 514 becomes constant at high level (H).

It should be noted that, during stable lighting operation at load connected state, there is substantially no fluctuation of the frequency at the frequency relatively close to the resonant frequency. Therefore, the output 5130 of the integrator 513 becomes as shown in FIG. 3C. Accordingly, in this case, the output voltage 5130 of the integrator 513 exceeds the reference voltage CF. Then, the comparator 514 issues no output 5140. Namely, the output 5140 of the comparator 514 is held at a low level (L).

Figure 17A:
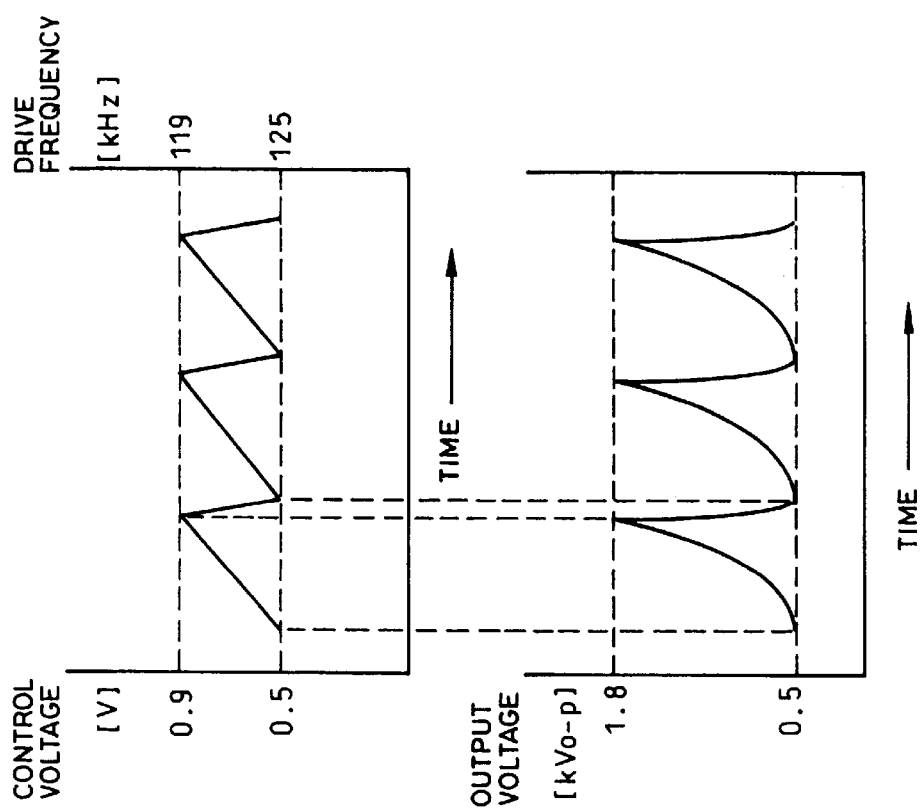
Figure 18A:
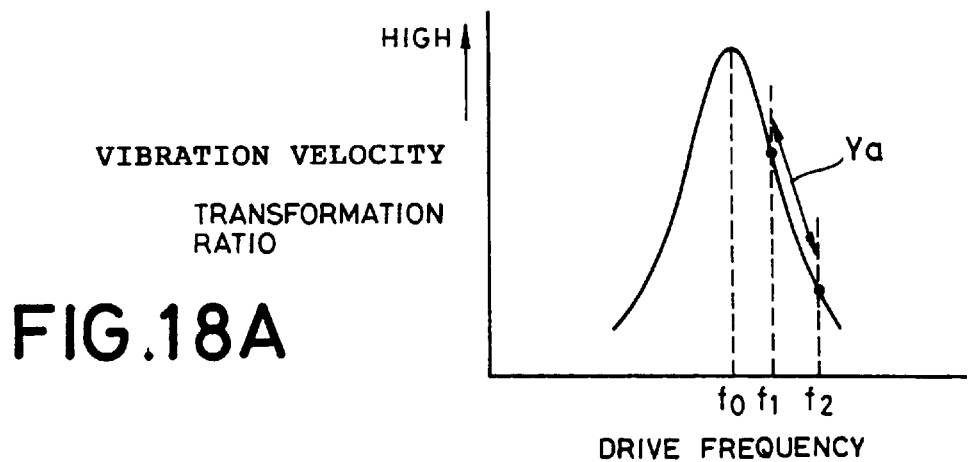
FIG. 18A is an illustration, in which a frequency sweeping operation shown in FIG. 17A is re-written on a transformation ratio-drive frequency curve.
Figure 18B:
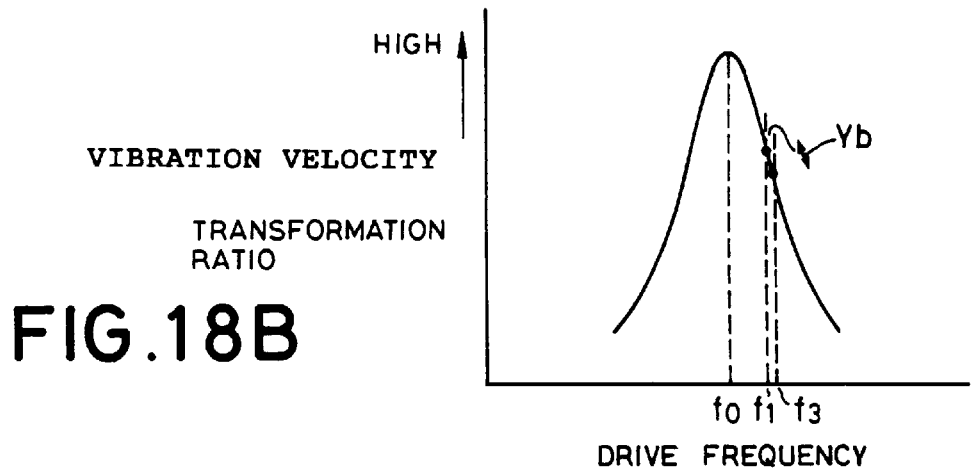
FIG. 18B is an illustration, in which a frequency sweeping operation shown in FIG. 17B is re-written on a transformation ratio-drive frequency curve.
Figure 18C:
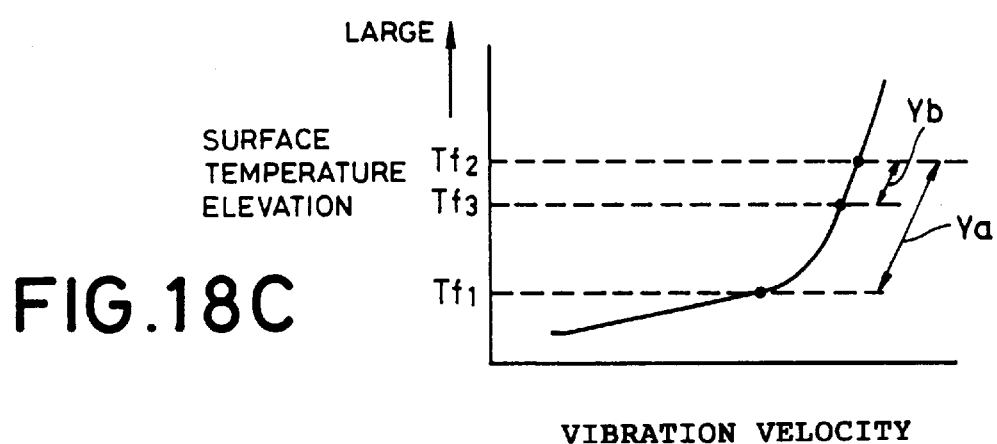
FIG. 18C is an illustration showing a relationship between the drive frequency and the surface temperature elevation of the piezoelectric transformer.
Figure 19:
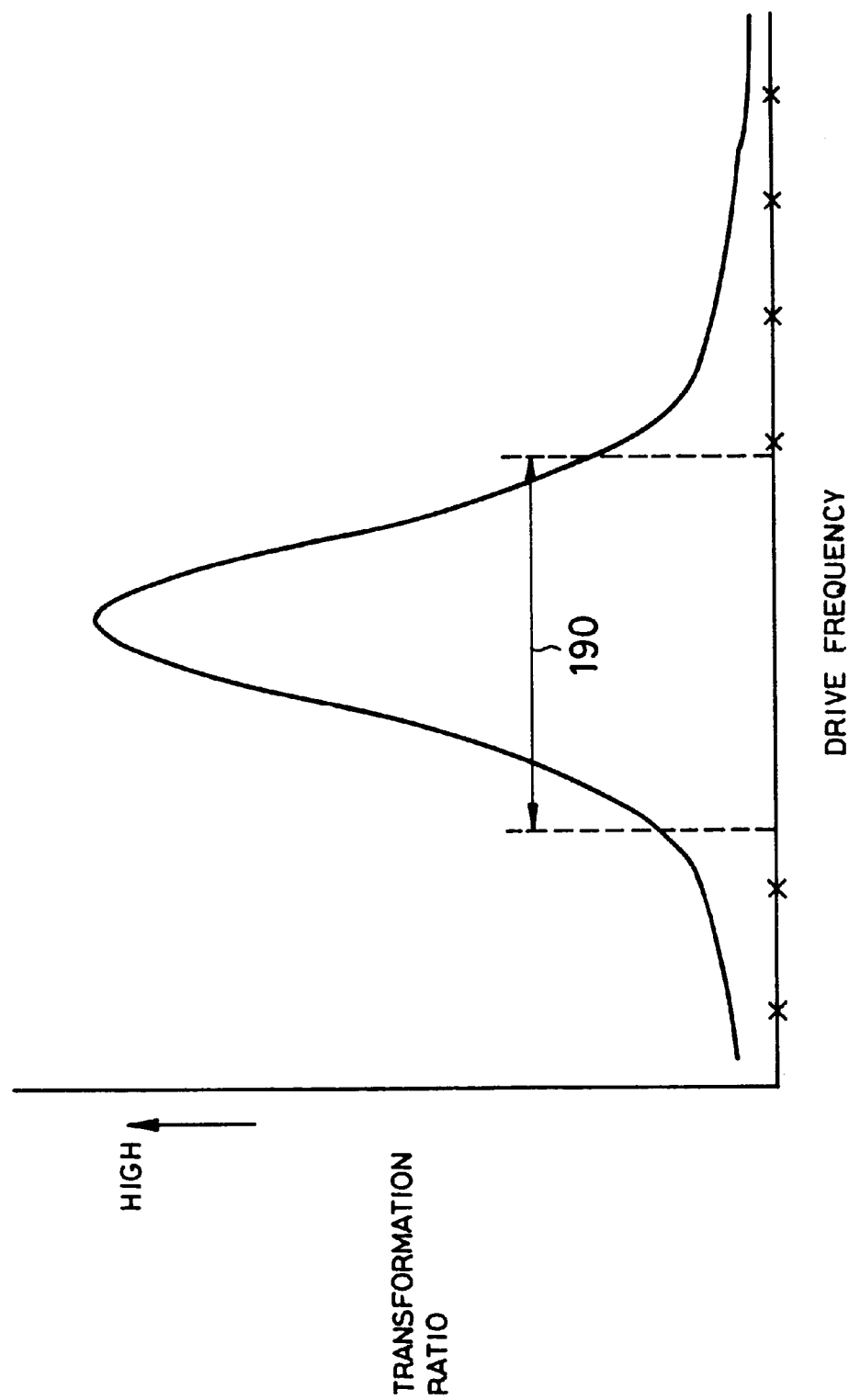
FIG. 19 is an illustration showing a relationship between the drive frequency of the piezoelectric transducer and a transformation ratio.

The output of the comparator 512 and the output of the comparator 514 are inputs of an AND circuit 515. Here, AND circuit 515 generates only output only at no load condition, and narrow sweeping frequency range. Accordingly, in the condition shown in FIG. 17A, the AND circuit 515 does not perform output, and in the condition shown in FIG. 17B, the AND circuit 515 performs output.

The output of the AND circuit 515 is connected to a base of a transistor 518 via a resistor 517. An emitter of the transistor 518 is grounded. A collector of the transistor 518 is connected in parallel to a resistor 524 determining the charge and discharge current value of the capacitor 523 of the oscillator 522 of the frequency sweeping oscillator 505 via resistor 516, in FIG. 4.

Figure 5B:
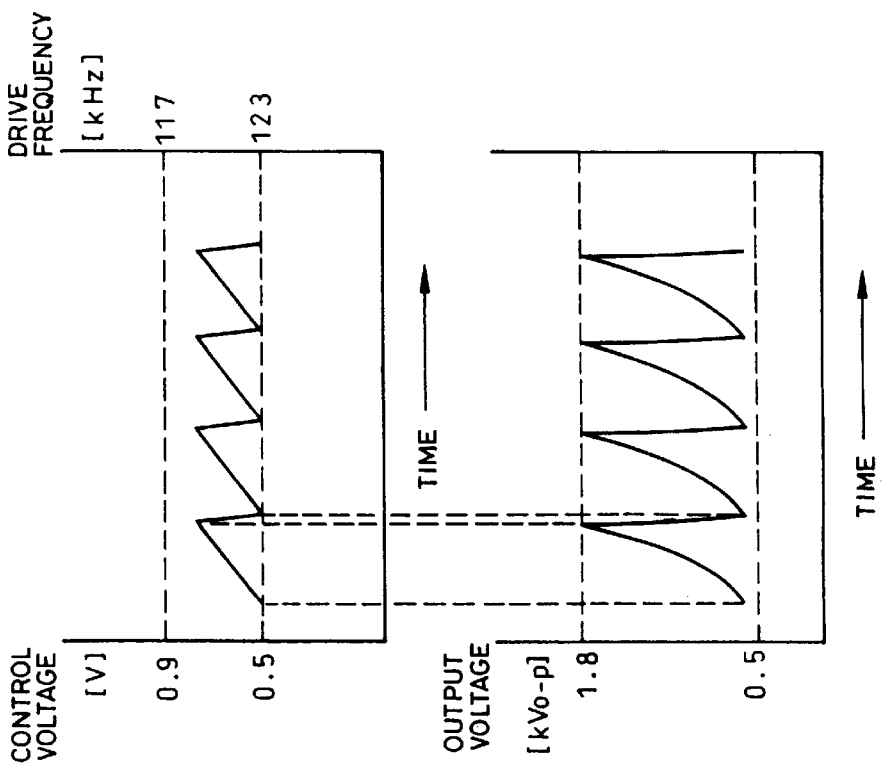
FIG. 5B is an illustration showing an example of sweeping operation after variation of the sweeping range.
Figure 5A:
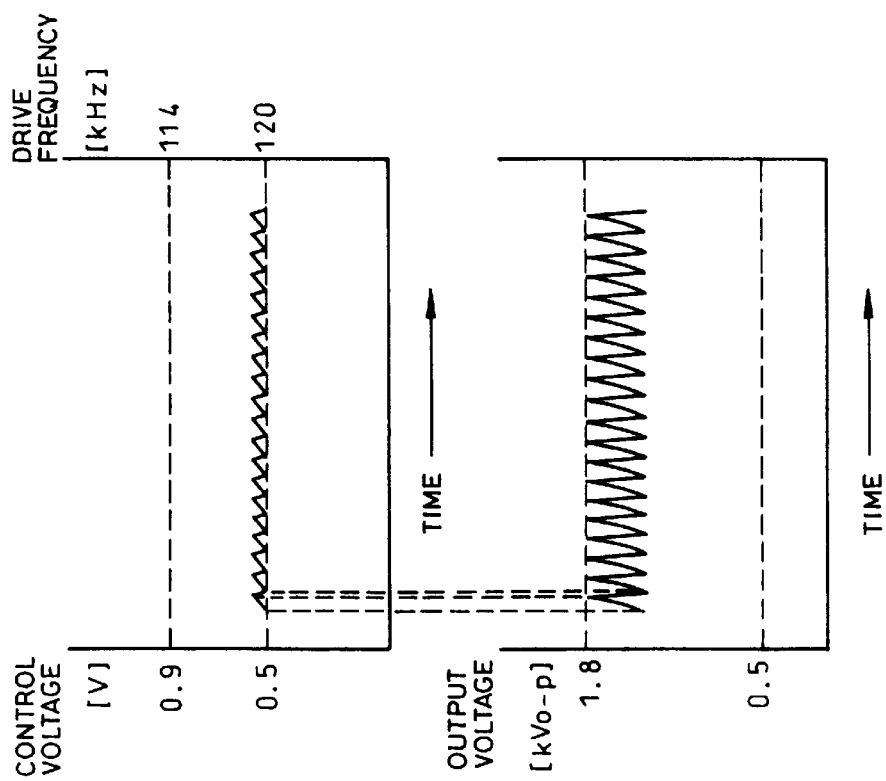
FIG. 5A is an illustration showing an example of sweeping operation upon initiation of no load operation.

The oscillator 522 is constructed to make the charge and discharge current value of the capacitor smaller at smaller resistance value of the resistor 524. When the resistor 516 is connected in parallel with the resistor 524, the charge and discharge current value of the capacitor 523 becomes large to make the oscillation frequency high. When operation shown in FIG. 5A is performed at a moment of initiation of the no load operation, the sweeping range varying circuit 510 detects excessive voltage of the output and narrow sweeping frequency range simultaneously to vary sweeping range to switch operation shown in FIG. 5B.

Next, discussion will be given for another embodiment of the present invention.

Figure 6:
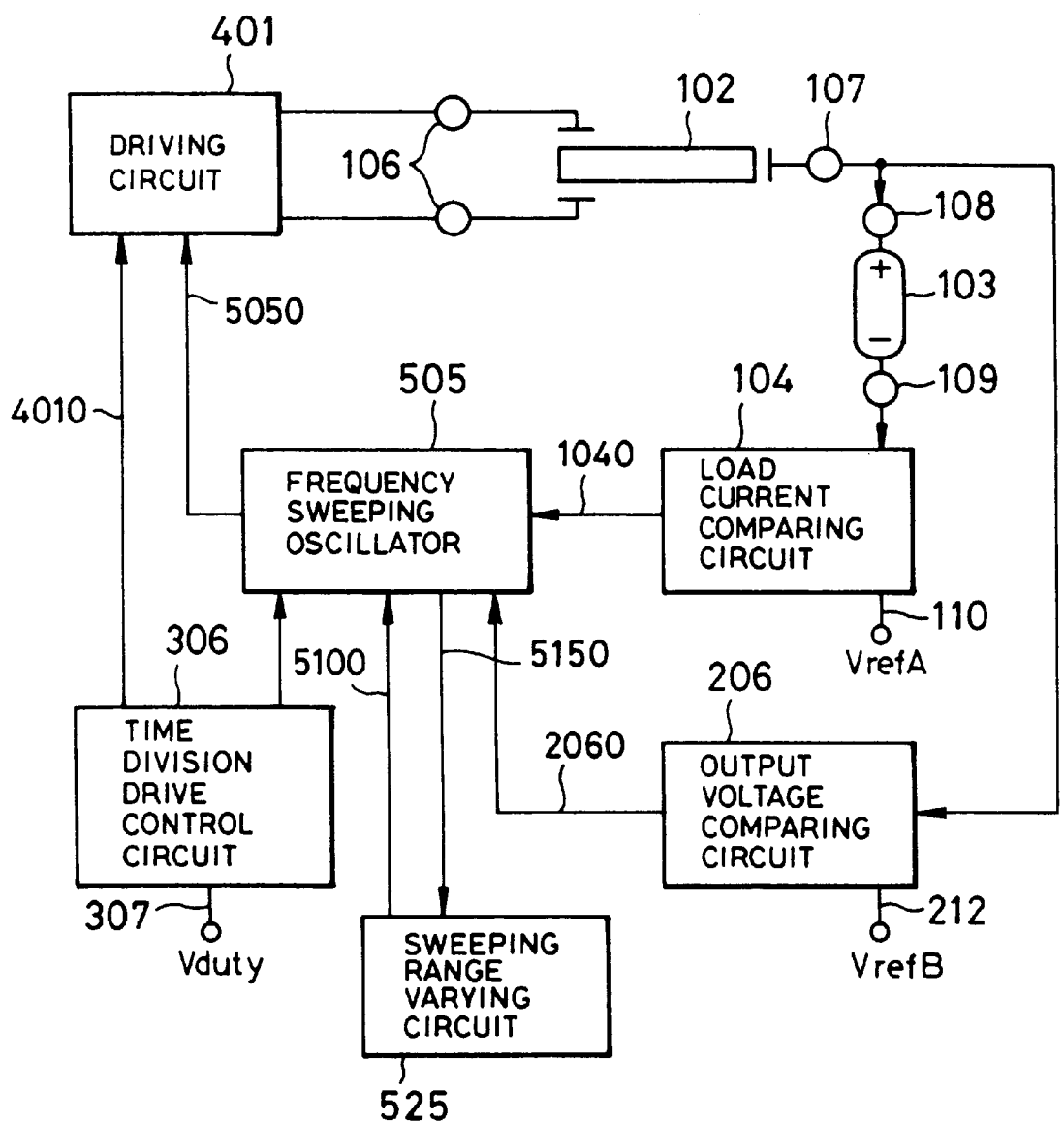
FIG. 6 is a block diagram showing another embodiment of a piezoelectric transformer driving circuit according to the present invention.

FIG. 6 is a block diagram showing a construction of another embodiment of a piezoelectric transformer driving circuit according to the present invention. In FIG. 6, like components to those of FIG. 1 are represented by like reference numerals to neglect detailed description for avoiding redundant discussion to keep the disclosure simple enough for facilitating clear understanding of the present invention. The shown embodiment of the piezoelectric transformer driving circuit is differentiated from that shown in FIG. 1, in that a sweeping range varying circuit 525 is employed in place the sweeping range varying circuit 510 in FIG. 1. It should be noted that, in the sweeping range varying circuit 525, the output 2060 of the output voltage comparing circuit 206 is not input.

Figure 7:
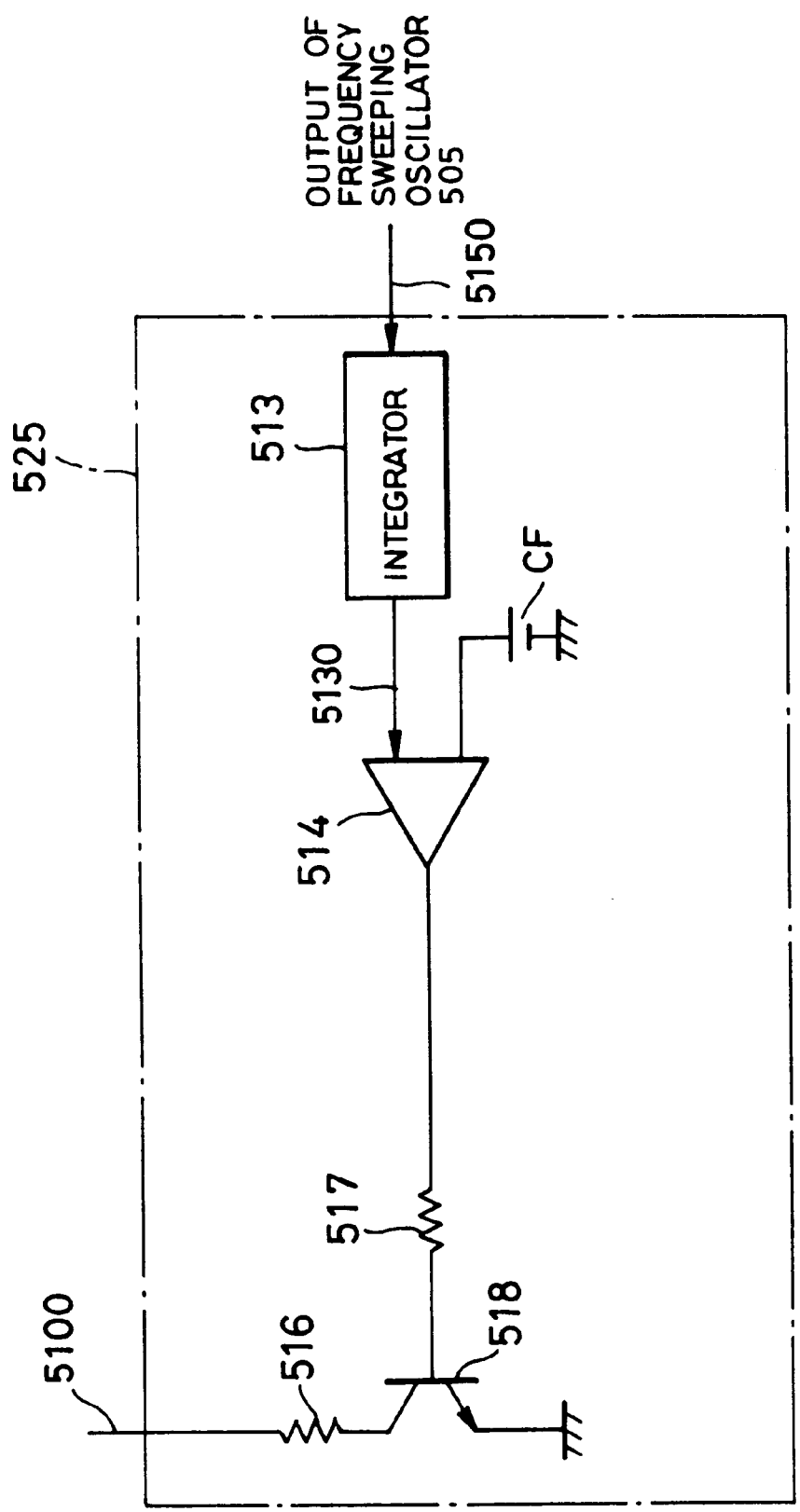
FIG. 7 is a block diagram showing an embodiment of an internal construction of the sweeping range varying circuit of FIG. 6.

The internal construction of the sweeping range varying circuit 525 in FIG. 6 is shown in FIG. 7. In FIG. 7, like components to those of FIG. 2 are represented by like reference numerals to neglect detailed description for avoiding redundant discussion to keep the disclosure simple enough for facilitating clear understanding of the present invention. In the sweeping range varying circuit 525 shown in FIG. 7, only output 5150 of the integrator 519 in the frequency sweeping oscillator 505 is integrated by the integrator 513. The output 5130 of the integrator 513 and the reference voltage CF are compared by the comparator 514.

Figure 8:
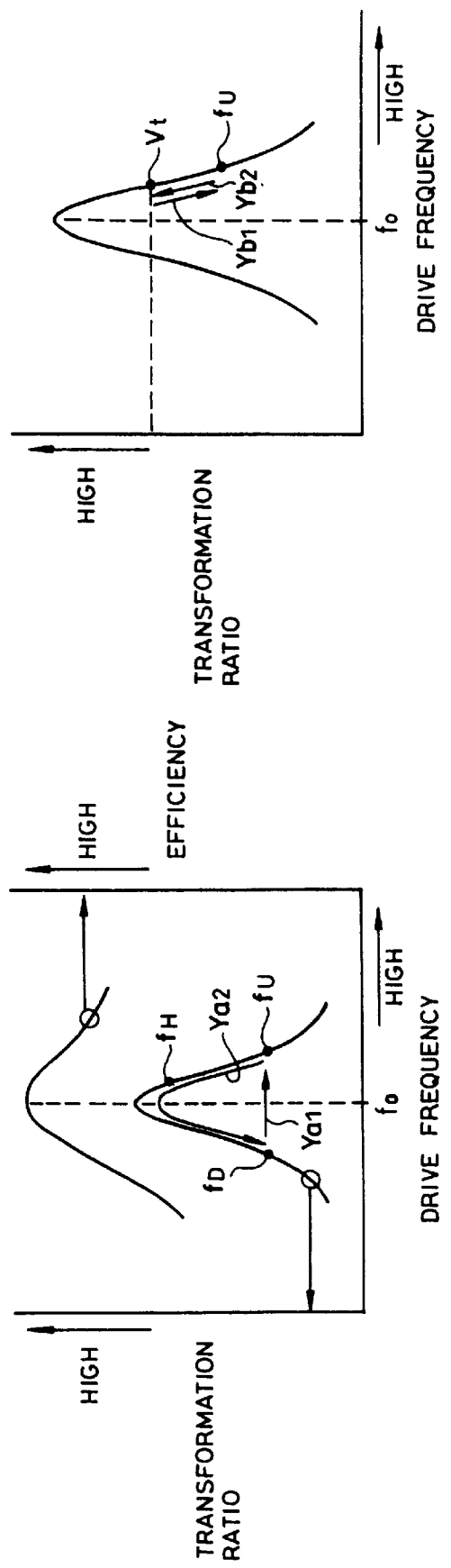
FIGS. 8A and 8B are illustrations showing transformation ratio and efficiency with respect to the drive frequency of the general piezoelectric transformer.

In general, when the direct current input voltage to the driving circuit is fluctuated, the desired load current output frequency of FIG. 8 is varied. On the other hand, when the environmental temperature fluctuates, characteristics of the load, the piezoelectric transformer or the circuit parts should fluctuate to cause variation of the desired load current output frequency. When the desired load current output frequency is varied, the voltage value of the output of the integrator 513 at the stable lighting operation at load connected state shown in FIG. 3C is varied.

Accordingly, within the sweeping range varying circuit 525, even when the reference voltage CF of the comparator 514 is set to a reasonable value under certain condition, the desired load current output frequency is elevated under other condition for outputting the integrator 513 even in the stable lightened state of load below the reference voltage CF to make the output of the comparator 514 high level.

Assuming that the sweeping range varying circuit has the circuit construction shown in FIG. 7, variation of the sweeping range is performed even when the load can be lightened stably. When the reference value CF and the output of the integrator 514 fluctuate around substantially the same value and large/small relationship thereof is switched frequently, varying of the sweeping range is repeated frequently to make voltage controlled oscillator control operation unstable to cause abnormal mode of lighting.

For the reason set forth above, in the circuit shown in FIG. 1, the sweeping range varying circuit 510 is constructed to output the signal for varying the sweeping range only when the output 5140 of the comparator 514 is high level and excessive voltage upon no load are detected.

From the foregoing, conversely, in the use method limiting the condition where the desired load current output frequency does not fluctuate, the sweeping range varying circuit 525 shown in FIG. 7 can be used. In FIG. 6, under the condition where fluctuation of the desired load current output frequency relative to the power source voltage, the load condition and environmental condition is small, the control voltage of the voltage controlled oscillator is monitored to detect continuation of the high voltage output by detecting small fluctuation of the control voltage within a specific voltage range.

As set forth above, when the output voltage comparing circuit 206 detects the excessive voltage and the oscillator control voltage value of the frequency sweeping oscillator 505 fluctuates at low value, the piezoelectric transformer 102 continues high voltage output. In this condition, since operation is performed at a condition where vibration velocity of the piezoelectric transformer is close to the extreme of own performance, degradation of characteristics of the piezoelectric transformer can be caused when the foregoing operation is continued for a long period. However, in the shown embodiment, the sweeping range varying circuit 510 monitors the output 2060 of the output voltage comparing circuit 206 and the oscillator control voltage 5150 of the frequency sweeping oscillator 505 to detect continuation of high voltage output. Then, if this condition is detected, charge and discharge current value of the capacitor 523 determining the frequency of the oscillator 522 is made greater to vary the upper limit frequency of the sweeping range of the drive frequency of the piezoelectric transformer toward high frequency side where transformation ratio is lower. By this sweeping is initiated from small value of the output voltage of the piezoelectric transformer to correct the effective value of the piezoelectric transformer vibration velocity to be smaller to prevent degradation of characteristics of the piezoelectric transformer.

It should be noted that the present invention should not be limited to the foregoing embodiments. In the piezoelectric transformer driving method driving the piezoelectric transformer with the driving voltage with sweeping the repetition frequency of the driving voltage with a predetermined sweeping range between the upper value and the lower value, outputting of high voltage of the piezoelectric transformer non-interrupting manner is detected. By employing the piezoelectric transformer driving method varying the upper limit value to higher repetition frequency, foregoing action and effect can be obtained, clearly.

As set forth above, according to the present invention, when the repetition frequency of the drive voltage is lower than the predetermined value, the sweeping range is narrower than the predetermined range and furthermore, the output voltage of the piezoelectric transformer is greater than the predetermined reference value, outputting of high voltage of the piezoelectric transformer non-interrupting manner is detected to vary the upper limit value of the repetition frequency to higher frequency to initiate sweeping of the output voltage of the piezoelectric transformer from smaller value, correct the effective value of the piezoelectric transformer vibration velocity toward smaller value to prevent degradation of characteristics of the piezoelectric transformer.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A piezoelectric transformer driving circuit for driving a piezoelectric transformer with a driving voltage by sweeping a repetition frequency of said driving voltage within a predetermined sweeping range between an upper limit value and a lower limit value, comprising:

detecting means for detecting a non-interrupted high voltage output of said piezoelectric transformer; and varying means for varying said repetition frequency higher than said upper limit value when said non-interrupted high voltage is detected by said detecting means.

2. A piezoelectric transformer driving circuit as set forth in claim 1, wherein said detecting means detects said non-interrupted high voltage output of said piezoelectric transformer by setting said repetition frequency lower than a predetermined value, said sweeping range narrower than a predetermined range, and an output voltage of said piezoelectric transformer greater than a predetermined reference value.

3. A piezoelectric transformer driving circuit as set forth in claim 1, wherein said detecting means detects said non-interrupted high voltage output of said piezoelectric transformer by setting said repetition frequency lower than a predetermined value and said sweeping range narrower than a predetermined range.

4. A piezoelectric transformer driving circuit as set forth in claim 2, wherein said detecting means comprises:

first detecting means for detecting when said repetition frequency is low and said sweeping range is narrow;

second detecting means for detecting when said output voltage of said piezoelectric transformer exceeds said predetermined reference value; and means for judging that a non-interrupted high voltage is output from said piezoelectric transformer when both of the detection outputs of said first detecting means and said second detecting means are output.

5. A piezoelectric transformer driving circuit as set forth in claim 4, wherein said first detecting means detects when said repetition frequency is lower than a predetermined frequency and said sweeping range is narrower than a predetermined range.

6. A piezoelectric transformer driving circuit as set forth in claim 5, wherein said first detecting means comprises:

integrating means for integrating a voltage controlling repetition frequency of said driving voltage of said piezoelectric transformer; and comparing means for comparing the integrated voltage controlling repetition frequency and a predetermined reference voltage value, said first detecting means detects when said repetition frequency is lower than a predetermined frequency and said sweeping range is narrower than a predetermined range as a result of the comparison made by said comparing means.

7. A piezoelectric transformer driving circuit as set forth in claim 1, wherein said repetition frequency of said driving voltage is generated depending upon an output frequency of an oscillator consisting of a resistor and a capacitor, said varying means controls variation of the oscillation frequency of said oscillator by controlling a current flowing through said resistor.

8. A piezoelectric transformer driving circuit as set forth in claim 7, wherein said varying means comprises a switching transistor for controlling said current flowing through said resistor, said switching transistor is turned ON and OFF when said non-interrupted high voltage is detected by said detecting means.

9. A piezoelectric transformer driving method for driving a piezoelectric transformer with a driving voltage by sweeping a repetition frequency of said driving voltage within a predetermined sweeping range between an upper limit value and a lower limit value, comprising the steps of:

detecting a non-interrupted high voltage output of said piezoelectric transformer; and varying said repetition frequency higher than said upper limit value when said non-interrupted high voltage is detected in the detecting step.

10. A piezoelectric transformer driving method as set forth in claim 9, wherein said detecting step detects said non-interrupted high voltage output of said piezoelectric transformer by setting said repetition frequency lower than a predetermined value, said sweeping range narrower than a predetermined range, and an output voltage of said piezoelectric transformer greater than a predetermined reference value.

11. A piezoelectric transformer driving method as set forth in claim 9, wherein said detecting step detects said non-interrupted high voltage output of said piezoelectric transformer by setting said repetition frequency lower than a predetermined value and said sweeping range narrower than a predetermined range.

12. A piezoelectric transformer driving method as set forth in claim 10, wherein said detecting step comprises:

a first detecting step for detecting a low said repetition frequency and a narrow said sweeping range; and a second detecting step for detecting said output voltage of said piezoelectric transformer exceeding said predetermined reference value, when both of the detection outputs of said first detecting step and said second detecting step are output, said non-interrupted high voltage output of said piezoelectric transformer is determined.

13. A piezoelectric transformer driving method as set forth in claim 12, wherein said first detecting step detects when said repetition frequency is lower than a predetermined frequency and said sweeping range is narrower than a predetermined range.

14. A piezoelectric transformer driving method as set forth in claim 13, wherein said first detecting step comprises the steps of:

integrating a voltage controlling repetition frequency of said driving voltage of said piezoelectric transformer; and comparing the integrated voltage controlling repetition frequency and a predetermined reference voltage value, said first detecting step detects when said repetition frequency is lower than a predetermined frequency and said sweeping range is narrower than a predetermined range as a result of the comparing step.

15. A piezoelectric transformer driving method as set forth in claim 9, wherein said repetition frequency of said driving voltage is generated depending upon an output frequency of an oscillator consisting of a resistor and a capacitor, said varying step controls variation of the oscillation frequency of said oscillator by controlling a current flowing through said resistor.

16. A piezoelectric transformer driving method as set forth in claim 15, wherein said varying step comprises a switching transistor for controlling said current flowing through said resistor, said switching transistor is turned ON and OFF when said non-interrupted high voltage is detected by said detecting step.

* * * * *